(12) United States Patent
Jung et al.

(10) Patent No.: US 11,600,621 B2
(45) Date of Patent: Mar. 7, 2023

(54) SEMICONDUCTOR MEMORY DEVICE AND METHOD OF FABRICATING THE SAME

(71) Applicant: Samsung Electronics Co., Ltd., Suwon-si (KR)

(72) Inventors: Kyooho Jung, Seoul (KR); Younsoo Kim, Yongin-si (KR); Young-lim Park, Anyang-si (KR); Jeong-Gyu Song, Seongnam-si (KR); Se Hyoung Ahn, Seoul (KR); Changmu An, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 17/412,801

(22) Filed: Aug. 26, 2021

(65) Prior Publication Data

US 2021/0391333 A1 Dec. 16, 2021

Related U.S. Application Data

(63) Continuation of application No. 16/897,589, filed on Jun. 10, 2020, now Pat. No. 11,133,314.

(30) Foreign Application Priority Data

Nov. 1, 2019 (KR) .................. 10-2019-0138586

(51) Int. Cl.
*H01L 27/108* (2006.01)
*H01L 49/02* (2006.01)
*H01L 21/02* (2006.01)

(52) U.S. Cl.
CPC .......... *H01L 27/10814* (2013.01); *H01L 21/02194* (2013.01); *H01L 27/10823* (2013.01);
(Continued)

(58) Field of Classification Search
CPC ......... H01L 27/10814; H01L 21/02194; H01L 27/10823; H01L 27/10855; H01L 27/10876; H01L 28/60; H01L 21/02181; H01L 21/02186; H01L 21/02189; H01L 21/7682; H01L 21/76897; H01L 27/10852; H01L 28/75; H01L 28/90; H01L 27/10808; H01L 21/28008; H01L 27/1085;
(Continued)

(56) References Cited

U.S. PATENT DOCUMENTS 5,838,530 A * 11/1998 Zhang ............... H01L 21/02252
257/532
6,417,537 B1 7/2002 Yang et al.
(Continued)

FOREIGN PATENT DOCUMENTS

KR 10-2017-0016748 A 2/2017

*Primary Examiner* — David Vu
(74) *Attorney, Agent, or Firm* — Harness, Dickey & Pierce, P.L.C.

(57) ABSTRACT

Disclosed are semiconductor memory devices and methods of fabricating the same. The semiconductor memory device comprises a capacitor that includes a bottom electrode, a top electrode opposite to the bottom electrode across a dielectric layer, and an interface layer between the bottom electrode and the dielectric layer. The interface layer includes a combination of niobium (Nb), titanium (Ti), oxygen (O), and nitrogen (N), and further includes a constituent of the dielectric layer.

20 Claims, 22 Drawing Sheets

(52) U.S. Cl.
CPC .. *H01L 27/10855* (2013.01); *H01L 27/10876* (2013.01); *H01L 28/60* (2013.01); *H01L 21/02181* (2013.01); *H01L 21/02186* (2013.01); *H01L 21/02189* (2013.01)

(58) Field of Classification Search
CPC . H01L 2924/01007; H01L 2924/01008; H01L 2924/01022; H01L 2924/01041
See application file for complete search history.

(56) References Cited

U.S. PATENT DOCUMENTS

| | | |
|---|---|---|
| 6,670,256 B2 | 12/2003 | Yang et al. |
| 7,271,055 B2 | 9/2007 | Lee et al. |
| 8,723,244 B2 | 5/2014 | Miyajima |
| 8,766,346 B1 | 7/2014 | Rui et al. |
| 8,896,097 B2 | 11/2014 | Wamura et al. |
| 9,543,375 B2 | 1/2017 | Huang et al. |
| 9,871,044 B2 | 1/2018 | Pandey et al. |
| 9,893,142 B2 | 2/2018 | Ahn et al. |
| 9,978,938 B2 * | 5/2018 | Trinh ...................... H01L 45/08 |
| 2017/0040172 A1 | 2/2017 | Moon et al. |
| 2018/0269211 A1 | 9/2018 | Kim et al. |

* cited by examiner

SEMICONDUCTOR MEMORY DEVICE AND METHOD OF FABRICATING THE SAME

CROSS-REFERENCE TO RELATED APPLICATION

This application is a continuation of U.S. nonprovisional application Ser. No. 16/897,589, filed on Jun. 10, 2020, which claims priority under 35 U.S.C § 119 to Korean Patent Application No. 10-2019-0138586 filed on Nov. 1, 2019, in the Korean Intellectual Property Office, the disclosures of each of which are hereby incorporated by reference in their entirety.

BACKGROUND

The present inventive concepts relate to a semiconductor, and more particularly, to a semiconductor memory device and a method of fabricating the same.

Semiconductor devices are beneficial in the electronic industry because of their small size, multi-functionality, and/or low fabrication cost. In particular, the semiconductor devices are being highly integrated with the remarkable development of the electronic industry. Line widths of patterns of semiconductor devices are being reduced for high integration thereof.

In particular, with the reduction in design rule of semiconductor memory devices such as DRAM, a difference between maximum and minimum values of capacitance is considerably increased due to oxidation of capacitor bottom electrodes. Accordingly, there is a great need for a semiconductor memory device and its fabrication method that can reduce or avoid the difference in capacitance.

SUMMARY

Some example embodiments of the present inventive concepts provide a semiconductor memory device with improved reliability and a method of fabricating the same.

Some example embodiments of the present inventive concepts provide a semiconductor memory device with reduced difference in capacitance and a method of fabricating the same.

According to some example embodiments of the present inventive concepts, a semiconductor memory device may comprise a capacitor that includes a bottom electrode, a top electrode opposite to the bottom electrode across a dielectric layer, and an interface layer between the bottom electrode and the dielectric layer. The interface layer may include a combination of niobium (Nb), titanium (Ti), oxygen (O), and nitrogen (N), and further include a constituent of the dielectric layer.

According to some example embodiments of the present inventive concepts, a semiconductor memory device may comprise a capacitor that includes a bottom electrode, a dielectric layer on the bottom electrode, a top electrode on the dielectric layer, and a lower interface layer between the bottom electrode and the dielectric layer.

The lower interface layer may include NbTiON and a metallic constituent of the dielectric layer. Niobium (Nb) contained in the lower interface layer may have a maximum amount of about 5 at %.

According to some example embodiments of the present inventive concepts, a semiconductor memory device may comprise a capacitor connected to a transistor on a substrate. The capacitor may include: a plurality of bottom electrodes supported by a support pattern, the support pattern connected to sidewalls of the bottom electrodes adjacent to the support pattern; a top electrode on the bottom electrodes; a dielectric layer between the top electrode and the bottom electrodes, the dielectric layer extending along surfaces of the bottom electrodes; and a lower interface layer between the dielectric layer and each of the bottom electrodes. The lower interface layer may include MNbTiON. The symbol M may be one of hafnium (Hf), zirconium (Zr), and a combination thereof.

According to some example embodiments of the present inventive concepts, a method of fabricating a semiconductor memory device may comprise: forming a capacitor bottom electrode on a substrate; forming a lower interface layer on the capacitor bottom electrode; forming a capacitor dielectric layer on the lower interface layer; and forming a capacitor top electrode on the capacitor dielectric layer. The lower interface layer may include a combination of niobium (Nb), titanium (Ti), oxygen (O), and nitrogen (N), and further include a metallic constituent of components included in the capacitor dielectric layer.

According to some example embodiments of the present inventive concepts, a method of fabricating a semiconductor memory device may comprise: providing a substrate on which are formed a plurality of bottom electrodes that are connected to each other through a support pattern; forming a lower interface layer on the bottom electrodes, the lower interface layer continuously extends along surfaces of the bottom electrodes and a surface of the support pattern; removing the lower interface layer formed on the surface of the support pattern to cause the lower interface layer to remain on the bottom electrodes; forming on the lower interface layer a dielectric layer that continuously extends along the bottom electrodes and the support pattern; and forming on the dielectric layer a top electrode that covers the bottom electrodes. The lower interface layer may include NbTiON and a metallic constituent of the dielectric layer. Niobium (Nb) contained in the lower interface layer may have a maximum amount of about 5 at %.

DETAILED DESCRIPTION OF EMBODIMENTS

It will now be discussed below in detail semiconductor memory devices and methods of fabricating the same in conjunction with the accompanying drawings.

When the terms "about" or "substantially" are used in this specification in connection with a numerical value, it is intended that the associated numerical value includes a manufacturing or operational tolerance (e.g., ±10%) around the stated numerical value.

Figure 1A:
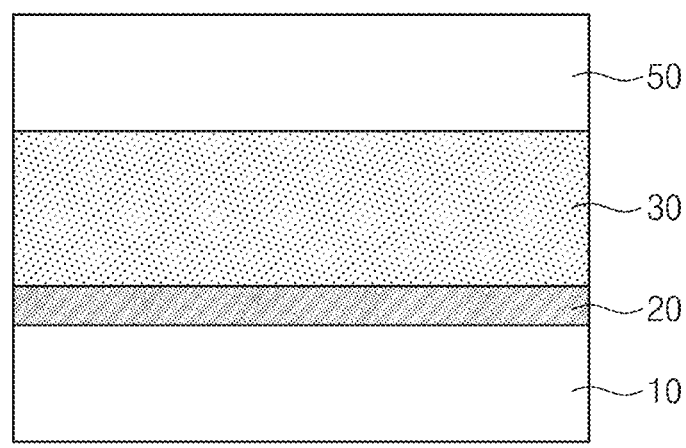
FIG. 1A illustrates a cross-sectional view showing a capacitor according to some example embodiments of the present inventive concepts.
Figure 1B:
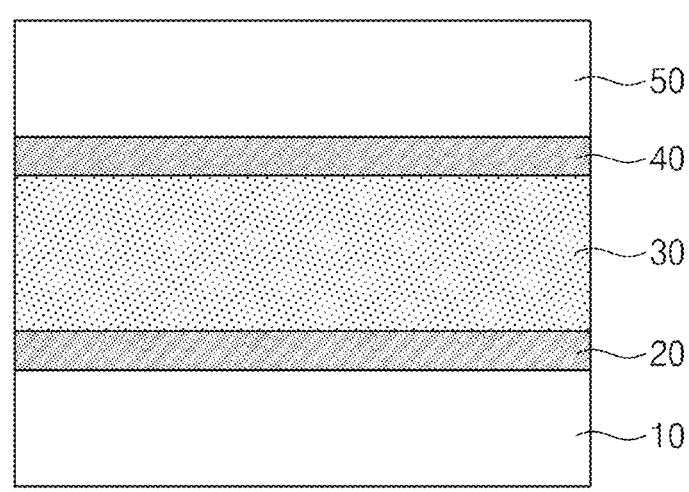
FIG. 1B illustrates a cross-sectional view showing a capacitor according to some example embodiments of the present inventive concepts.

FIG. 1A illustrates a cross-sectional view showing a capacitor according to some example embodiments of the present inventive concepts. FIG. 1B illustrates a cross-sectional view showing a capacitor according to some example embodiments of the present inventive concepts.

Referring to FIG. 1A, a capacitor 1 may include a bottom electrode 10, a dielectric layer 30 on the bottom electrode 10, a top electrode 50 opposite to the bottom electrode 10 across the dielectric layer 30, and/or an interface layer 20 between the bottom electrode 10 and the top electrode 50.

The bottom electrode 10 and the top electrode 50 may independently include one or more of an impurity-doped polysilicon layer, an impurity-doped silicon-germanium layer, a metal nitride layer such as a titanium nitride layer or a hafnium nitride layer, and a metal layer including metal such as tungsten, copper, or aluminum.

The dielectric layer 30 may include an oxide layer of hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof.

The interface layer 20 may include niobium (Nb), titanium (Ti), oxygen (O), and nitrogen (N), and further include at least one constituent such as metal included in the dielectric layer 30. Alternatively, the interface layer 20 may include a combination of niobium (Nb), titanium (Ti), oxygen (O), and nitrogen (N), and further include a material such as hafnium (Hf), titanium (Ti), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof, which is different from constituents of the dielectric layer 30. The interface layer 20 may have semiconductor properties.

In some embodiments, when the dielectric layer 30 includes zirconium oxide (e.g., ZrOx), the interface layer 20 may include a combination of niobium (Nb), titanium (Ti), oxygen (O), nitrogen (N), and zirconium (Zr). Alternatively, when the dielectric layer 30 includes hafnium oxide (e.g., HfOx), the interface layer 20 may include a combination of niobium (Nb), titanium (Ti), oxygen (O), nitrogen (N), and hafnium (Hf).

As discussed above, when the dielectric layer 30 includes MOx, the interface layer 20 may include MNbTiON. Herein, the symbol M may be a metallic constituent such as zirconium (Zr) or hafnium (Hf). The symbol M may include titanium (Ti), tantalum (Ta), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof instead of zirconium (Zr) or hafnium (Hf).

In some embodiments, when the dielectric layer 30 includes titanium oxide (e.g., TiOx), the interface layer 20 may include a combination of niobium (Nb), titanium (Ti), oxygen (O), and nitrogen (N), and further include hafnium (Hf), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof.

For example, when the dielectric layer 30 includes titanium oxide (e.g., TiOx), the interface layer 20 may include ZrNbTiON, HfNbTiON, or a combination thereof. An amount of about 5 at % or less may be given to niobium (Nb) contained in ZrNbTiON or HfNbTiON. For example, the amount of niobium (Nb) may range from about 2 at % to about 3 at %. The amount of niobium (Nb) is not limited to the case where the interface layer 20 includes ZrNbTiON, HfNbTiON, or a combination thereof. For example, when the interface layer 20 includes MNbTiON (where, M is metal), niobium (Nb) may have an amount of about 5 at % or less, narrowly from about 2 at % to about 3 at %.

In some embodiments, when the dielectric layer 30 includes zirconium oxide (e.g., ZrOx), hafnium oxide (e.g., HfOx), titanium oxide (e.g., TiOx), or any combination thereof, the interface layer 20 may include ZrNbTiON, HfNbTiON, or a combination thereof.

The interface layer 20 may be formed as discussed below. The following formation is a mere example, and the present inventive concepts are not limited thereto.

In some embodiments, metal may be deposited to sequentially form the interface layer 20 and the dielectric layer 30 on the bottom electrode 10. The interface layer 20 may include NbTiON. Niobium (Nb) may have an amount of about 5 at % or less, more narrowly from about 2 at % to about 3 at %. When the interface layer 20 is formed, the interface layer 20 may consume a portion of the bottom electrode 10. For example, diffusion of heat required for the formation of the interface layer 20 may cause the interface layer 20 to expand into the bottom electrode 10.

The dielectric layer 30 may be formed by depositing zirconium oxide (e.g., ZrOx) or hafnium oxide (e.g., HfOx). When the dielectric layer 30 is formed, at least one constituent such as hafnium (Hf) or zirconium (Zr) included in the dielectric layer 30 may diffuse or migrate into the interface layer 20. Therefore, the interface layer 20 may include NbTiON and further include a metallic constituent, such as hafnium (Hf) or zirconium (Zr), which is a metallic constituent of the dielectric layer 30. For example, the interface layer 20 may include ZrNbTiON, HfNbTiON, or a combination thereof.

The top electrode 50 may be formed by depositing metal on the dielectric layer 30. The capacitor 1 may then be formed which includes the bottom electrode 10 and the top electrode 50 that are opposite to each other across the dielectric layer 30, and which includes the interface layer 20 between the bottom electrode 10 and the dielectric layer 30. The bottom electrode 10, the interface layer 20, the dielectric layer 30, and the top electrode 50 may be formed by a deposition process, such as chemical vapor deposition (CVD), physical vapor deposition (PVD), or atomic layer deposition (ALD).

In some embodiments, the bottom electrode 10 may be deposited thereon with the interface layer 20 including ZrNbTiON, HfNbTiON, or a combination thereof. Niobium (Nb) may have an amount of about 5 at % or less, narrowly from about 2 at % to about 3 at %. As discussed above, the interface layer 20 may expand into the bottom electrode 10. The dielectric layer 30 and the top electrode 50 may be sequentially deposited on the interface layer 20, with the result that the capacitor 1 may be formed. The dielectric layer 30 may include an oxide layer of hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof.

Referring to FIG. 1B, the capacitor 1 may include the interface layer 20 (referred to hereinafter as a lower interface layer) between the bottom electrode 10 and the dielectric layer 30, and further include an interface layer 40 (referred to hereinafter as an upper interface layer) between the dielectric layer 30 and the top electrode 50. For example, the upper interface layer 40 and the top electrode 50 may be sequentially deposited on the dielectric layer 30, which may result in the formation of the capacitor 1 that has a mirror image about the dielectric layer 30. The upper interface layer 40 may have an identical or similar configuration to that of the lower interface layer 20. For example, the upper interface layer 40 may include ZrNbTiON, HfNbTiON, or a combination thereof, and may have semiconductor properties. Niobium (Nb) may have an amount of about 5 at % or less, narrowly from about 2 at % to about 3 at %.

The upper interface layer 40 may have the same or different constituents from those of the lower interface layer 20. For example, each of the lower and upper interface layers 20 and 40 may include ZrNbTiON, HfNbTiON, or a combination thereof. Alternatively, one of the lower and upper interface layers 20 and 40 may include ZrNbTiON, and the other of the lower and upper interface layers 20 and 40 may include HfNbTiON.

Differently from the present embodiments, when a capacitor is formed by depositing a dielectric layer and a top electrode on a bottom electrode, a native oxide layer may be formed between the bottom electrode and the dielectric layer. For example, a native oxide layer such as titanium oxide (e.g., $TiO_x$) may have semiconductor properties, and thus a depletion layer may be created in the native oxide layer when the capacitor is supplied with voltage, which may result in the loss of capacitance. The loss of capacitance may induce a capacitance difference between when a logic "1" is stored in the capacitor and when a logic "0" is stored in the capacitor. An increase in capacitance difference may generate a greater difference between maximum and minimum values of the capacitance, and thus discrimination between the logic "0" and the logic "1" may become unclear due to such capacitance difference.

Figure 1C:
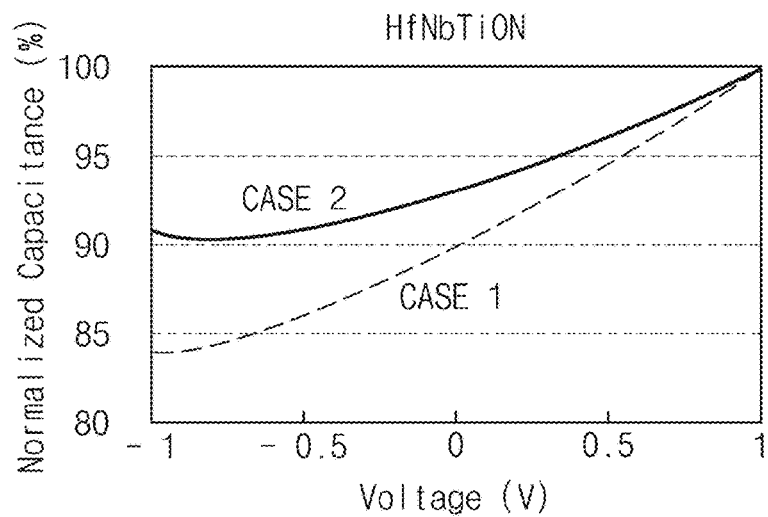
FIG. 1C illustrates a graph showing capacitance of a capacitor according to some example embodiments of the present inventive concepts.
Figure 1D:
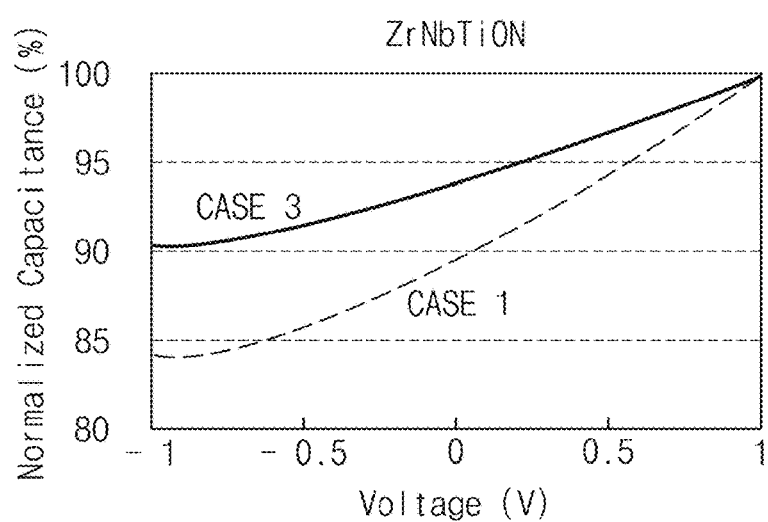
FIG. 1D illustrates a graph showing capacitance of a capacitor according to some example embodiments of the present inventive concepts.

In contrast, according to the present embodiments, because the bottom electrode 10 and the dielectric layer 30 have therebetween the interface layer 20 that is formed to include one of ZrNbTiON, HfNbTiON, and a combination thereof each of which has an energy bandgap greater than that of, for example, titanium oxide (e.g., $TiO_x$), it may be possible to reduce, potentially, dramatically, a difference between maximum and minimum values of capacitance, and this will be further discussed below with reference to FIGS. 1C and 1D.

FIG. 1C illustrates a graph showing capacitance of a capacitor according to some example embodiments of the present inventive concepts. FIG. 1D illustrates a graph showing capacitance of a capacitor according to some example embodiments of the present inventive concepts.

Referring to FIG. 1C together with FIG. 1A, a dotted line may represent capacitance in a first case CASE1 where the bottom electrode 10 and the dielectric layer 30 have therebetween a native oxide layer or no interface layer 20, and a solid line may denote capacitance in a second case CASE2 where the bottom electrode 10 and the dielectric layer 30 are provided therebetween with the interface layer 20 including HfNbTiON.

When the capacitor 1 is stored therein with a logic "0" by providing the capacitor 1 with a positive bias to allow flow of current from the top electrode 50 toward the bottom electrode 10, the first and second cases CASE1 and CASE2 may all have capacitance of about 100%. Alternatively, when the capacitor 1 is stored therein with a logic "1" by providing the capacitor 1 with a negative bias to allow flow of current from the bottom electrode 10 toward the top electrode 50, the first case CASE1 may have capacitance of about 85% or less, while the second case CASE2 may have capacitance of about 91% or more.

In conclusion, as shown in the graph of FIG. 1C, it may be ascertained that, compared to the first case CASE1, the second case CASE2 has an about 6% point or more increase in the minimum value of capacitance.

Referring to FIG. 1D together with FIG. 1A, a dotted line may represent capacitance in the first case CASE1, and a solid line may denote capacitance in a third case CASE3 where the bottom electrode 10 and the dielectric layer 30 are provided therebetween with the interface layer 20 including ZrNbTiON.

When a positive bias is applied to the capacitor 1, the first and third cases CASE1 and CASE3 may all have capacitance of about 100%. Alternatively, when a negative bias is applied to the capacitor 1, the first case CASE1 may have capacitance of about 84% or less, while the second case CASE2 may have capacitance of about 90% or more.

In conclusion, as shown in the graph of FIG. 1D, it may be ascertained that, compared to the first case CASE1, the third case CASE3 has an about 6% point or more increase in the minimum value of capacitance.

Figure 2A:
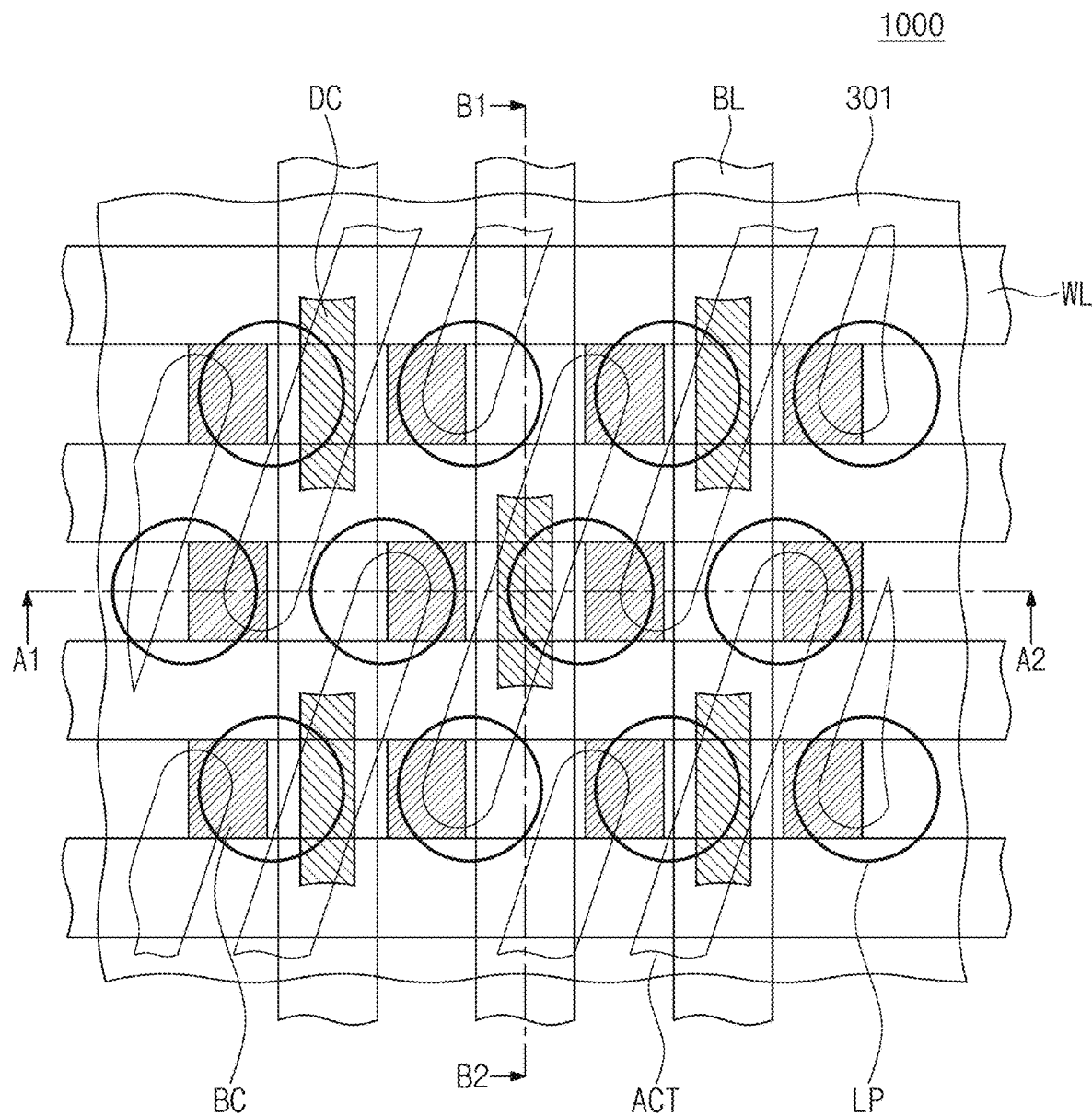
FIG. 2A illustrates a plan view showing a semiconductor memory device that includes a capacitor according to some example embodiments of the present inventive concepts.
Figure 2B:
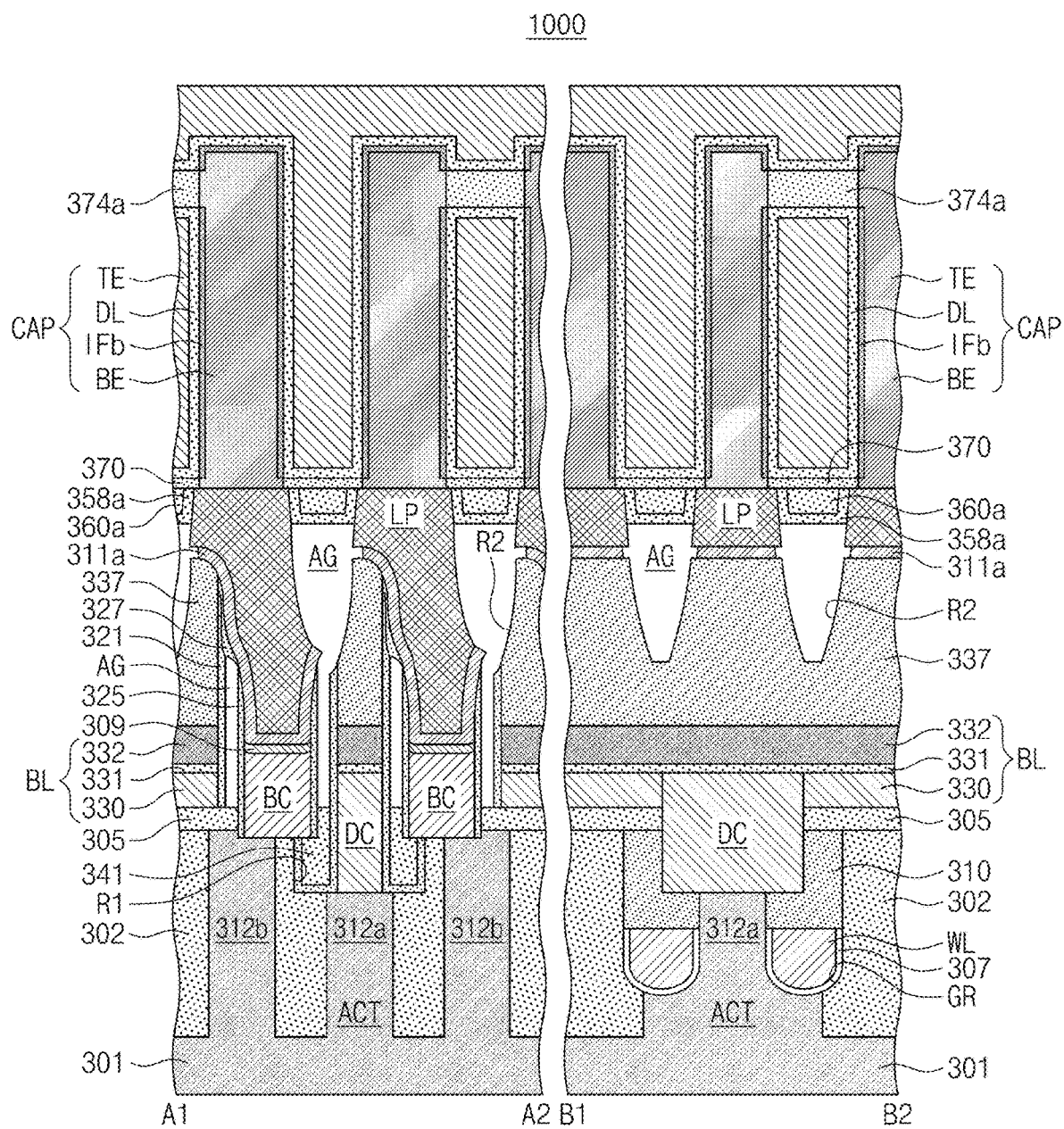
FIG. 2B illustrates a cross-sectional view taken along lines A1-A2 and B1-B2 of FIG. 2A, showing a semiconductor memory device that includes a capacitor according to some example embodiments of the present inventive concepts.
Figure 2C:
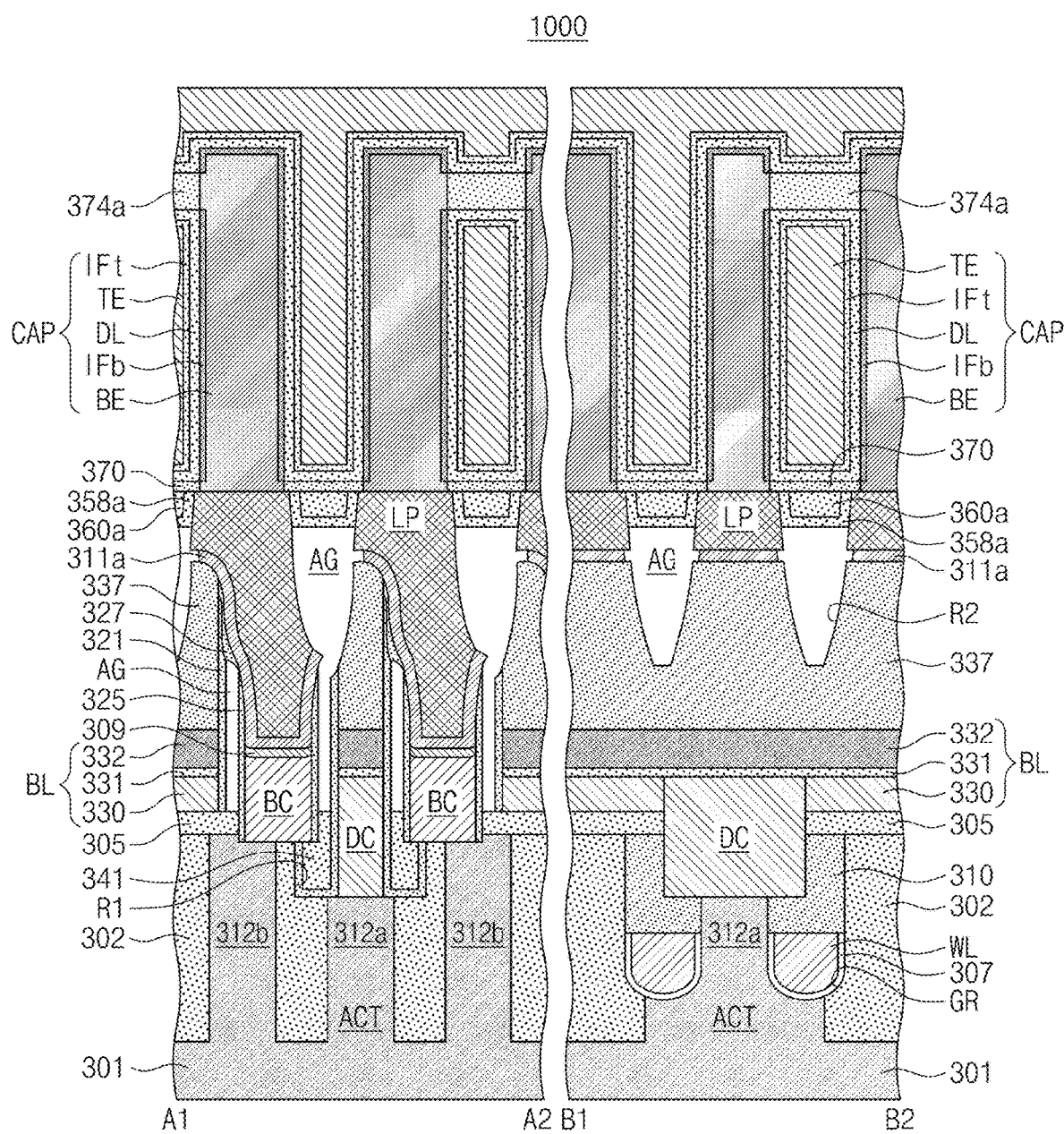
FIG. 2C illustrates a cross-sectional view taken along lines A1-A2 and B1-B2 of FIG. 2A, showing a semiconductor memory device that includes a capacitor according to some example embodiments of the present inventive concepts.

FIG. 2A illustrates a plan view showing a semiconductor memory device that includes a capacitor according to some example embodiments of the present inventive concepts. FIG. 2B illustrates a cross-sectional view taken along lines A1-A2 and B1-B2 of FIG. 2A, showing a semiconductor memory device that includes a capacitor according to some example embodiments of the present inventive concepts. FIG. 2C illustrates a cross-sectional view taken along lines A1-A2 and B1-B2 of FIG. 2A, showing a semiconductor memory device that includes a capacitor according to some example embodiments of the present inventive concepts.

Referring to FIGS. 2A and 2B, a substrate 301 may be provided therein with a device isolation pattern 302 that defines active sections ACT. The substrate 301 may be a semiconductor substrate. Each of the active sections ACT may have an isolated shape. When viewed in plan, each of the active sections ACT may have a bar shape elongated along a third direction D3. When viewed in plan, the active sections ACT may correspond to portions of the substrate 301 that are surrounded by the device isolation pattern 302. The substrate 301 may include a semiconductor material. The active sections ACT may be arranged parallel to each other in the third direction D3, and one of the active sections ACT may have an end portion adjacent to a central portion of a neighboring one of the active sections ACT.

Word lines WL may run across the active sections ACT. The word lines WL may be disposed in corresponding grooves GR formed on the device isolation pattern 302 and the active sections ACT. The word lines WL may be parallel to a first direction D1 that intersects the third direction D3. The word lines WL may include a conductive material. A gate dielectric layer 307 may be disposed between the word line WL and an inner surface of groove GR. The gate dielectric layer 307 may include one or more of thermal oxide, silicon nitride, silicon oxynitride, and high-k dielectric. The word lines WL may have their curved bottom surfaces.

A first impurity region 312a may be disposed in the active section ACT between a pair of word lines WL, and a pair of second impurity regions 312b may be disposed in opposite edge portions of each active section ACT. The first and second impurity regions 312a and 312b may be doped with, for example, N-type impurities. The first impurity region 312a may correspond to a common drain region, and the second impurity regions 312b may correspond to source regions. Each word line WL and its adjacent first and second impurity regions 312a and 312b may constitute a transistor.

The word lines WL may have their top surfaces lower than those of the active sections ACT. A word-line capping pattern 310 may be disposed on each word line WL. The word-line capping patterns 310 may have their linear shapes that extend along longitudinal directions of the word lines WL, and may cover the top surfaces of the word lines WL. The word-line capping patterns 310 may be formed of, for example, a silicon nitride layer.

An interlayer dielectric pattern 305 may be disposed on the substrate 301. The interlayer dielectric pattern 305 may be formed of a single-layered or multi-layered structure that includes at least one selected from a silicon oxide layer, a silicon nitride layer, and a silicon oxynitride layer. The interlayer dielectric pattern 305 may be formed to have island shapes that are spaced apart from each other when viewed in plan. The interlayer dielectric pattern 305 may simultaneously cover end portions of two adjacent active sections ACT.

Upper portions of the substrate 301, the device isolation pattern 302, and the word-line capping pattern 310 may be partially recessed to provide a first recess R1. The first recess R1 may have a net shape when viewed in plan. Bit lines BL may be disposed on the interlayer dielectric pattern 305. The bit lines BL may run across the word-line capping patterns 310 and the word lines WL.

As disclosed in FIG. 2A, the bit lines BL may extend in a second direction D2 that intersects the first and third directions D1 and D3. Each of the bit lines BL may include a polysilicon pattern 330, an ohmic pattern 331, and a metal-containing pattern 332 that are sequentially stacked. The polysilicon pattern 330 may include impurity-doped polysilicon or impurity-undoped polysilicon.

The ohmic pattern 331 may include metal silicide. The metal-containing pattern 332 may include one or more of metal (e.g., tungsten, titanium, or tantalum) and conductive metal nitride (e.g., titanium nitride, tantalum nitride, or tungsten nitride). Bit-line capping patterns 337 may be disposed on corresponding bit lines BL. The bit-line capping patterns 337 may include a dielectric material, such as silicon nitride.

A bit-line contact DC may be disposed in the first recess R1 that intersects the bit line BL. The bit-line contact DC may include impurity-doped polysilicon or impurity-undoped polysilicon. The bit-line contact DC may be electrically coupled to the first impurity region 312a, and may electrically connect the first impurity region 312a to the bit line BL.

A buried dielectric pattern 341 may be disposed in a portion of the first recess R1, which portion is not occupied by the bit-line contact DC. The buried dielectric pattern 341 may have a single-layered or multi-layered structure that includes one or more of a silicon oxide layer, a silicon nitride layer, and a silicon oxynitride layer.

As shown in FIG. 2A, storage node contacts BC may be disposed between a pair of adjacent bit lines BL. The plurality of storage node contacts BC may be spaced apart from each other. The storage node contacts BC may include impurity-doped polysilicon or impurity-undoped polysilicon. The storage node contacts BC may have their concave top surfaces.

The bit line BL and the storage node contact BC may have therebetween a bit-line spacer including a first spacer 321 and a second spacer 325 that are spaced apart from each other across an air gap AG. The first spacer 321 may cover a sidewall of the bit line BL and a sidewall of the bit-line capping pattern 337. The second spacer 325 may be adjacent to the storage node contact BC. The first spacer 321 and the second spacer 325 may include the same material. For example, the first and second spacers 321 and 325 may include silicon nitride.

The second spacer 325 may have a bottom surface lower than that of the first spacer 321. The second spacer 325 may have a top end whose level is lower than that of a top end of the first spacer 321. Therefore, it may be possible to increase a margin for forming a landing pad LP which will be discussed below and then to reduce or prevent disconnection between the landing pad LP and the storage node contact BC. The first spacer 321 may extend to cover a sidewall of the bit-line contact DC and a sidewall and a bottom surface of the first recess R1.

A storage node ohmic layer 309 may be disposed on the storage node contact BC. The storage node ohmic layer 309 may include metal silicide. The storage node ohmic layer 309, the first and second spacers 321 and 325, and the bit-line capping pattern 337 may be covered with a diffusion break pattern 311a. The diffusion break pattern 311a may include metal nitride, such as titanium nitride or tantalum nitride. A landing pad LP may be disposed on the diffusion break pattern 311a. The landing pad LP may include a material containing metal such as tungsten. The landing pad LP may have an upper portion that covers a top surface of the bit-line capping pattern 337 and has a width greater than that of the storage node contact BC.

As shown in FIG. 2A, a center of the landing pad LP may shift in the first direction D1 from a center of the storage node contact BC. A portion of the bit line BL may vertically overlap the landing pad LP. One upper sidewall of the bit-line capping pattern 337 may overlap the landing pad LP and may be covered with a third spacer 327. A second recess R2 may be formed on other upper sidewall of the bit-line capping pattern 337.

A first capping pattern 358a may be provided between neighboring landing pads LP. The first capping pattern 358a may be shaped like a liner and may have an inside filled with a second capping pattern 360a. The first and second capping patterns 358a and 360a may independently include a silicon nitride layer, a silicon oxide layer, a silicon oxynitride layer, or a porous layer. The first capping pattern 358a may have its porosity greater than that of the second capping pattern 360a.

The air gap AG between the first and second spacers 321 and 325 may extend into a space between the landing pads LP. The air gap AG may expose a bottom surface of the first capping pattern 358a. The air gap AG may extend toward the diffusion break pattern 311a. For example, the diffusion break pattern 311a may be recessed between the landing pad LP and the bit-line capping pattern 337.

Bottom electrodes BE may be disposed on corresponding landing pads LP. The bottom electrode BE may include one or more of a metal nitride layer, such as an impurity-doped polysilicon layer or a titanium nitride layer, and a metal layer, such as a tungsten layer, an aluminum layer, or a copper layer. The bottom electrode BE may have a circular columnar shape, a hollow cylindrical shape, or a cup shape. A support pattern 374a may be provided between neighboring bottom electrodes BE, thereby supporting the bottom electrodes BE. The support pattern 374a may include a dielectric material, such as silicon nitride, silicon oxide, or silicon oxynitride.

Between the bottom electrodes BE, the first and second capping patterns 358a and 360a may be covered with an etch stop layer 370. The etch stop layer 370 may include a dielectric material, such as silicon nitride, silicon oxide, or silicon oxynitride. A dielectric layer DL may cover a surface of each of the bottom electrode BE, the support pattern 374a, and the etch stop layer 370. The dielectric layer DL may be covered with a top electrode TE. An interface layer IFb may be provided between the dielectric layer DL and the bottom electrode BE. The top electrode TE may include one or more of an impurity-doped polysilicon layer, an impurity-doped silicon-germanium layer, a metal nitride layer such as a titanium nitride layer, and a metal layer including tungsten, aluminum, or copper.

A capacitor CAP may be constituted by the bottom electrode BE, the interface layer IFb, the dielectric layer DL, and the top electrode TE. Accordingly, there may be provided a semiconductor memory device 1000 including the capacitor CAP.

The bottom electrode BE, the interface layer IFb, the dielectric layer DL, and the top electrode TE may respectively correspond to the bottom electrode 10, the interface layer 20, the dielectric layer 30, and the top electrode 50 of FIG. 1A. The description of the interface layer 20 in FIG. 1A may be applicable identically or similarly to the interface layer IFb. For example, the interface layer IFb may include niobium (Nb), titanium (Ti), oxygen (O), and nitrogen (N), and further include a metallic constituent such as zirconium (Zr) or hafnium (Hf). The metallic constituent such as zirconium (Zr) or hafnium (Hf) may be a constituent of the dielectric layer DL. Because the capacitor CAP includes the interface layer IFb, a minimum value of capacitance may increase as discussed above in FIG. 1C or 1D.

For another example, as shown in FIG. 2C, an interface layer IFt may further be provided between the top electrode TE and the dielectric layer DL. The interface layer IFt may correspond to the interface layer 40 of FIG. 1B. The description of the interface layer 40 in FIG. 1B may be applicable identically or similarly to the interface layer IFt.

Figure 3A:
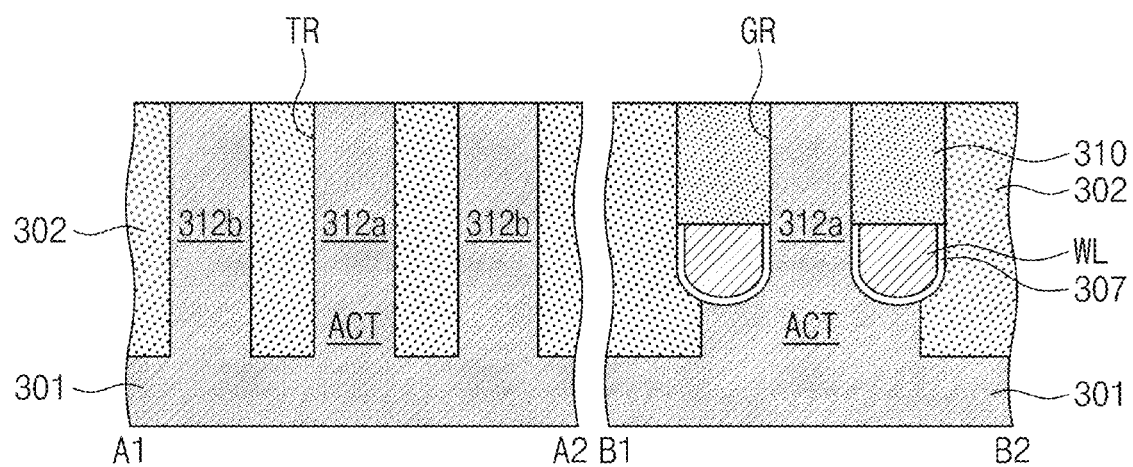
FIGS. 3A to 3T illustrate cross-sectional views taken along lines A1-A2 and B1-B2 of FIG. 2A, showing a method of fabricating a semiconductor memory device that includes a capacitor according to some example embodiments of the present inventive concepts.
Figure 3B:
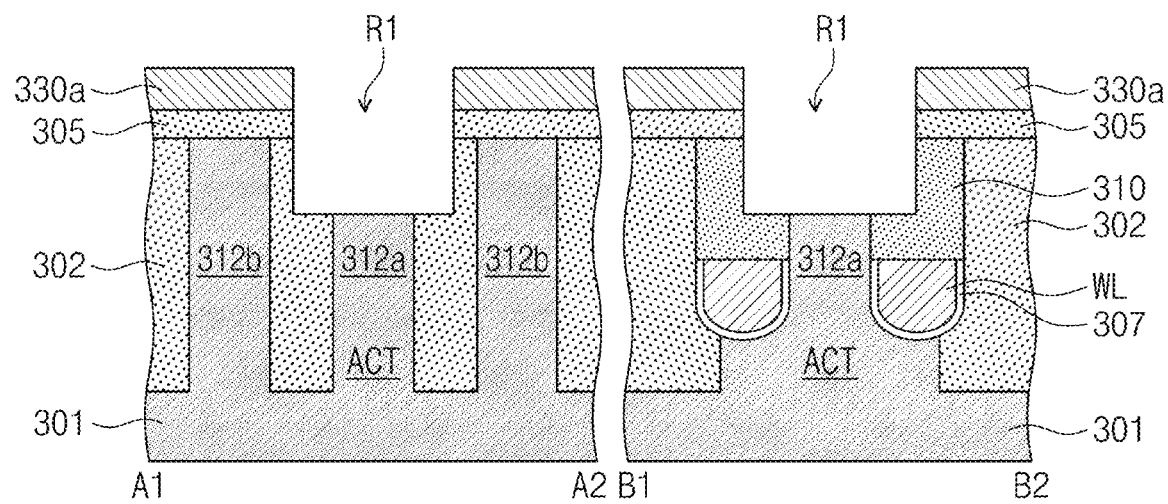
Figure 3C:
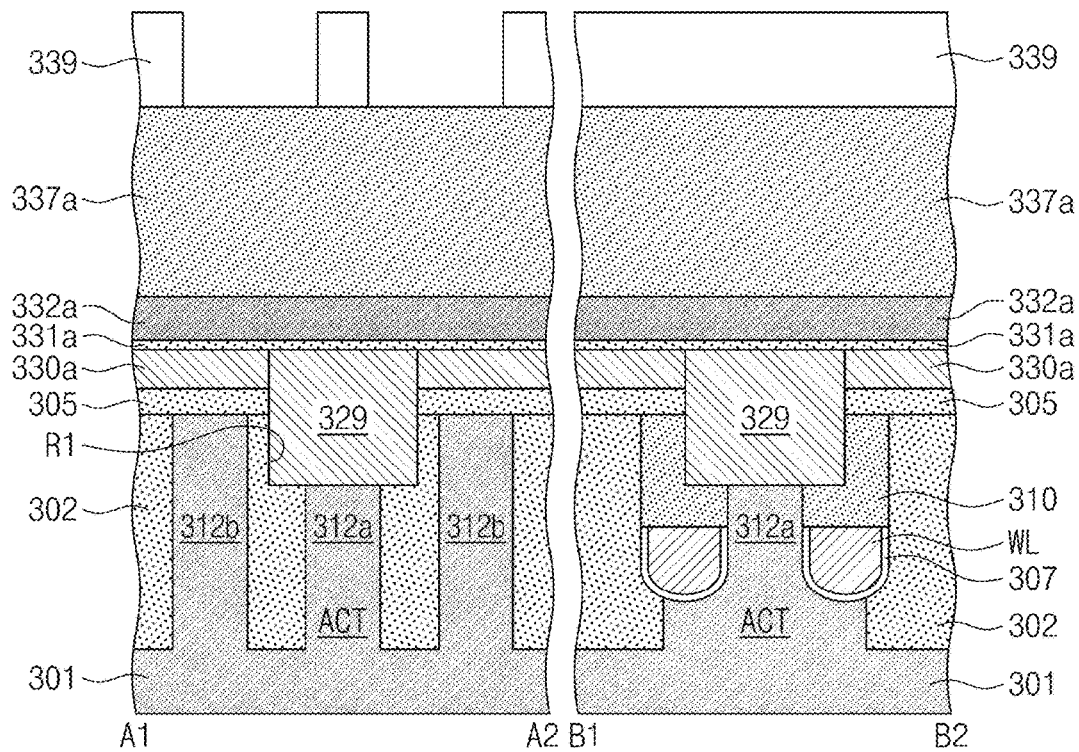
Figure 3D:
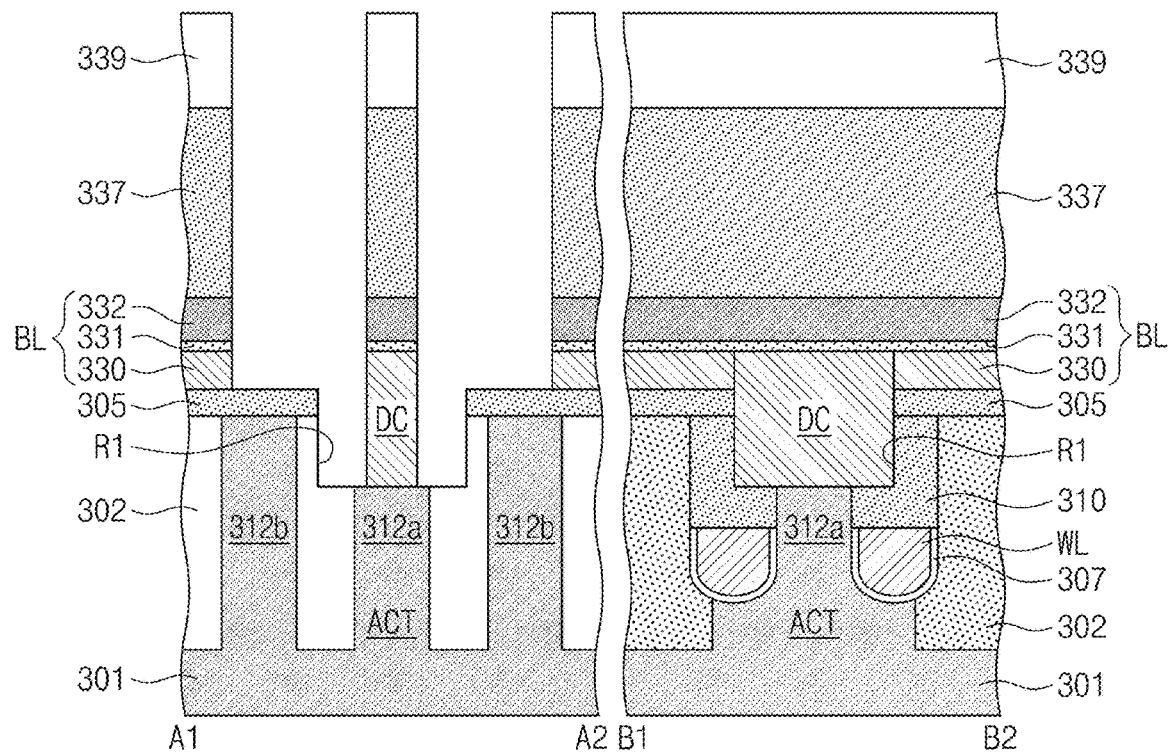
Figure 3E:
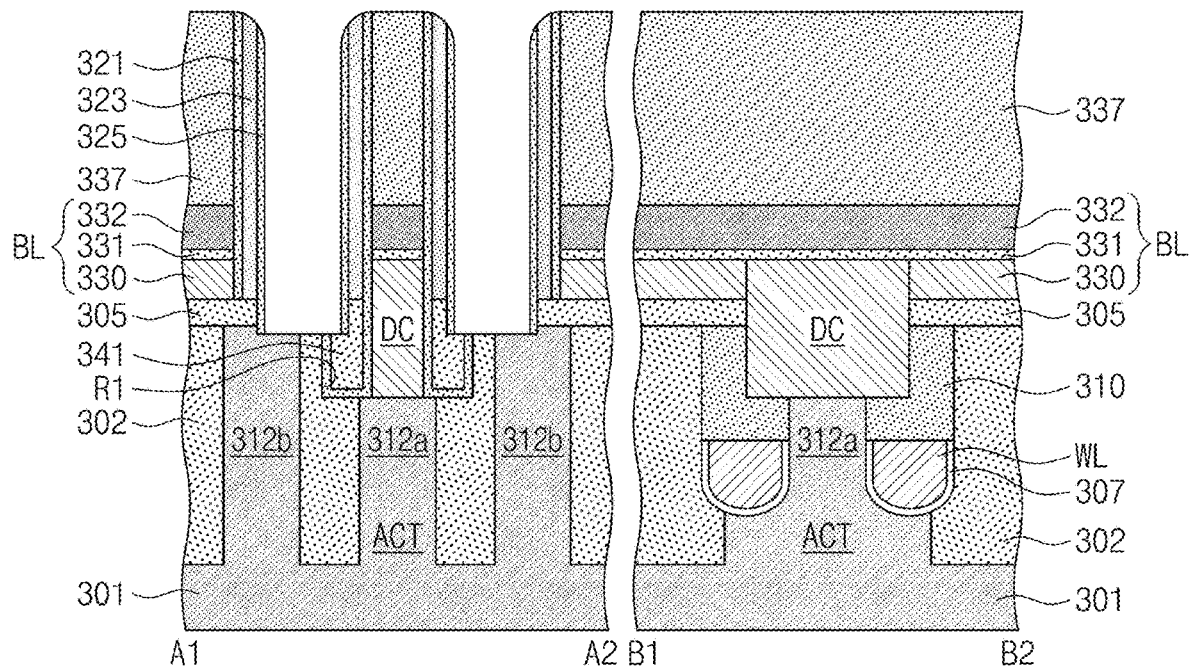
Figure 3F:
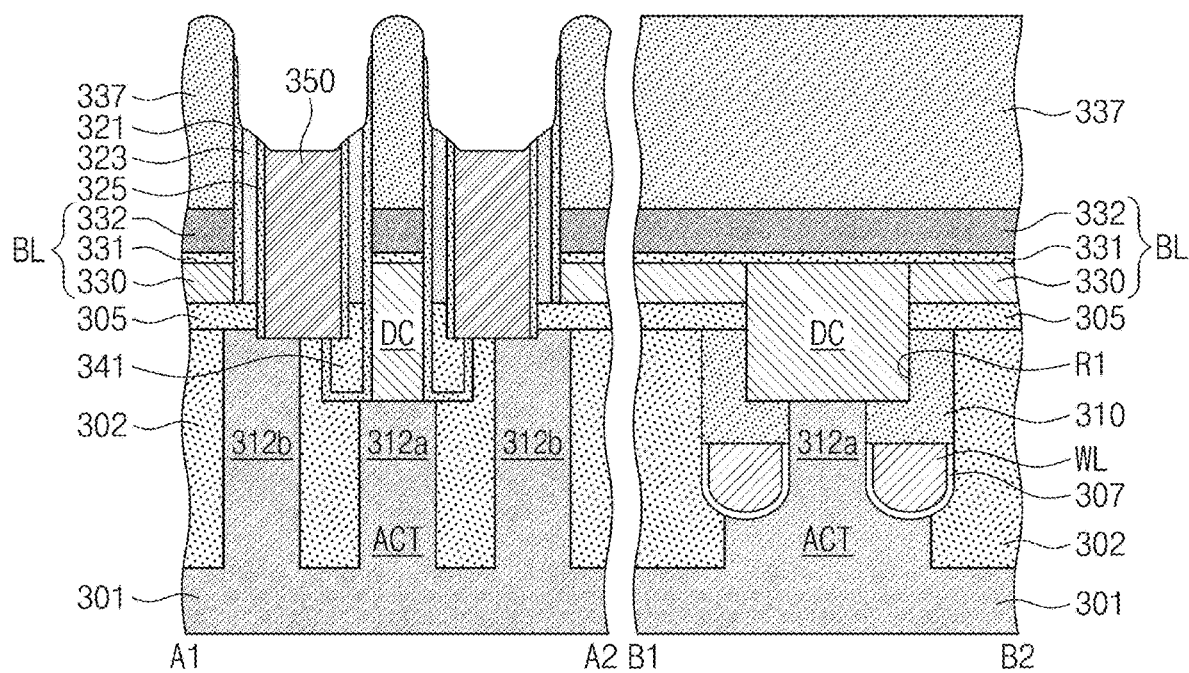
Figure 3G:
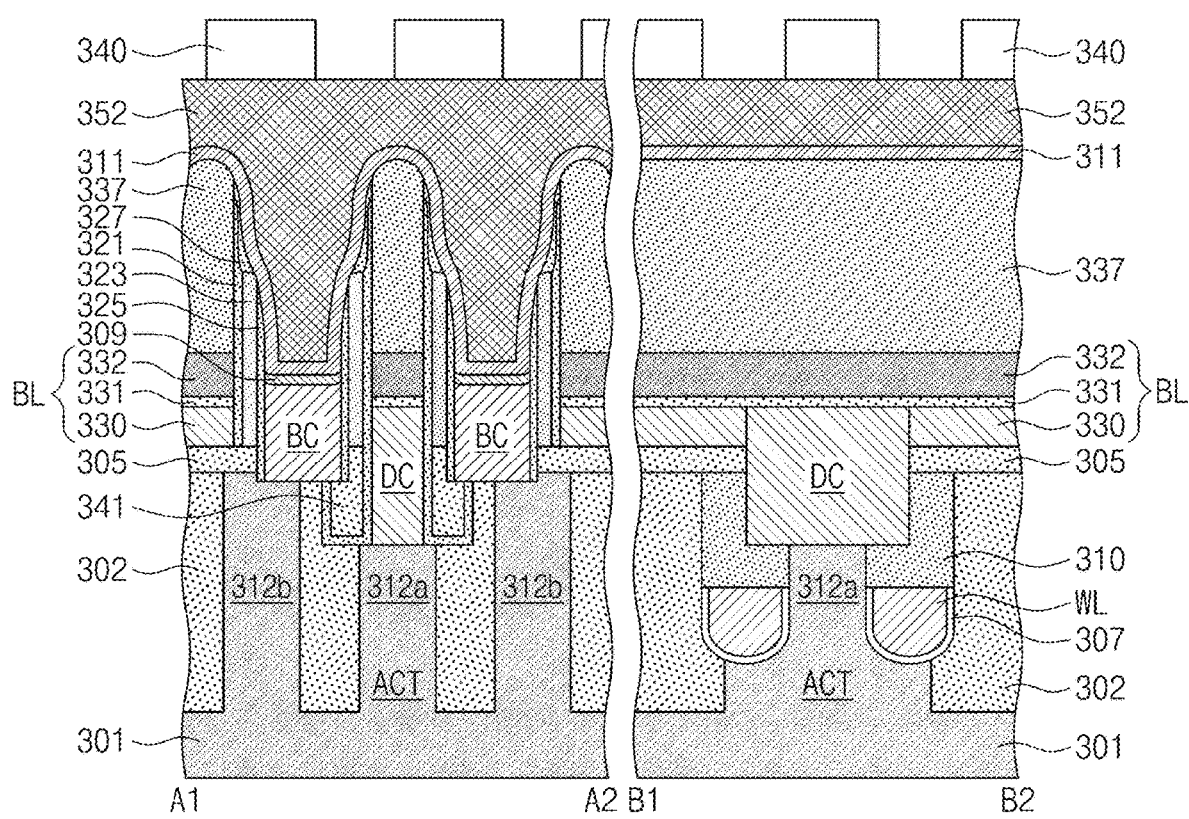
Figure 3H:
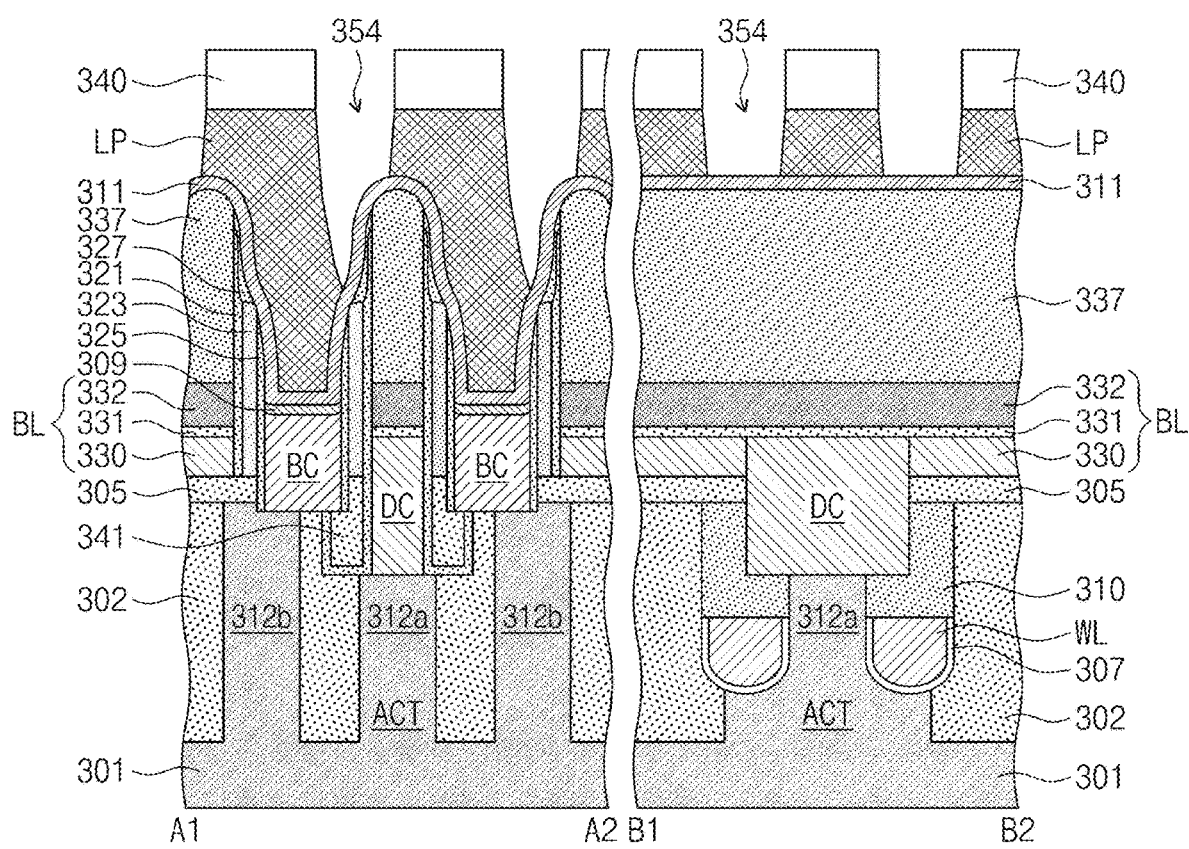
Figure 3I:
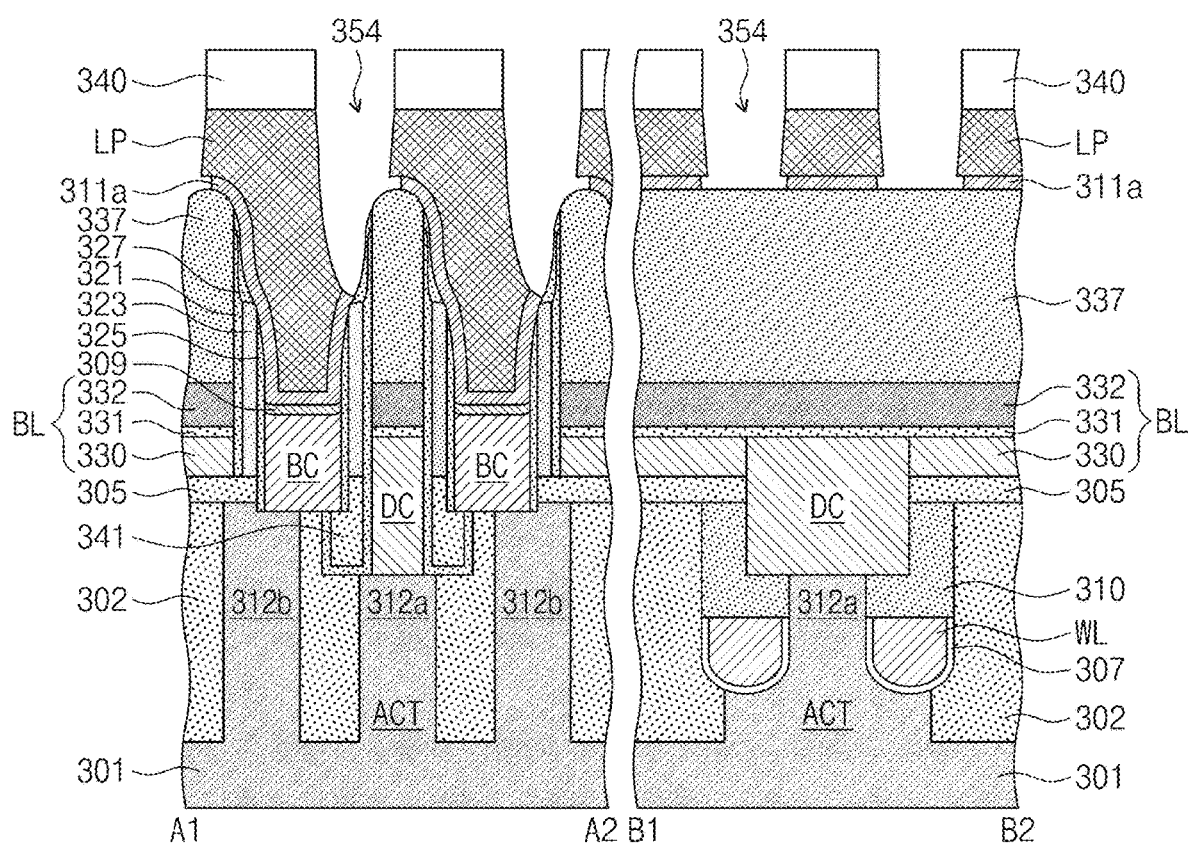
Figure 3J:
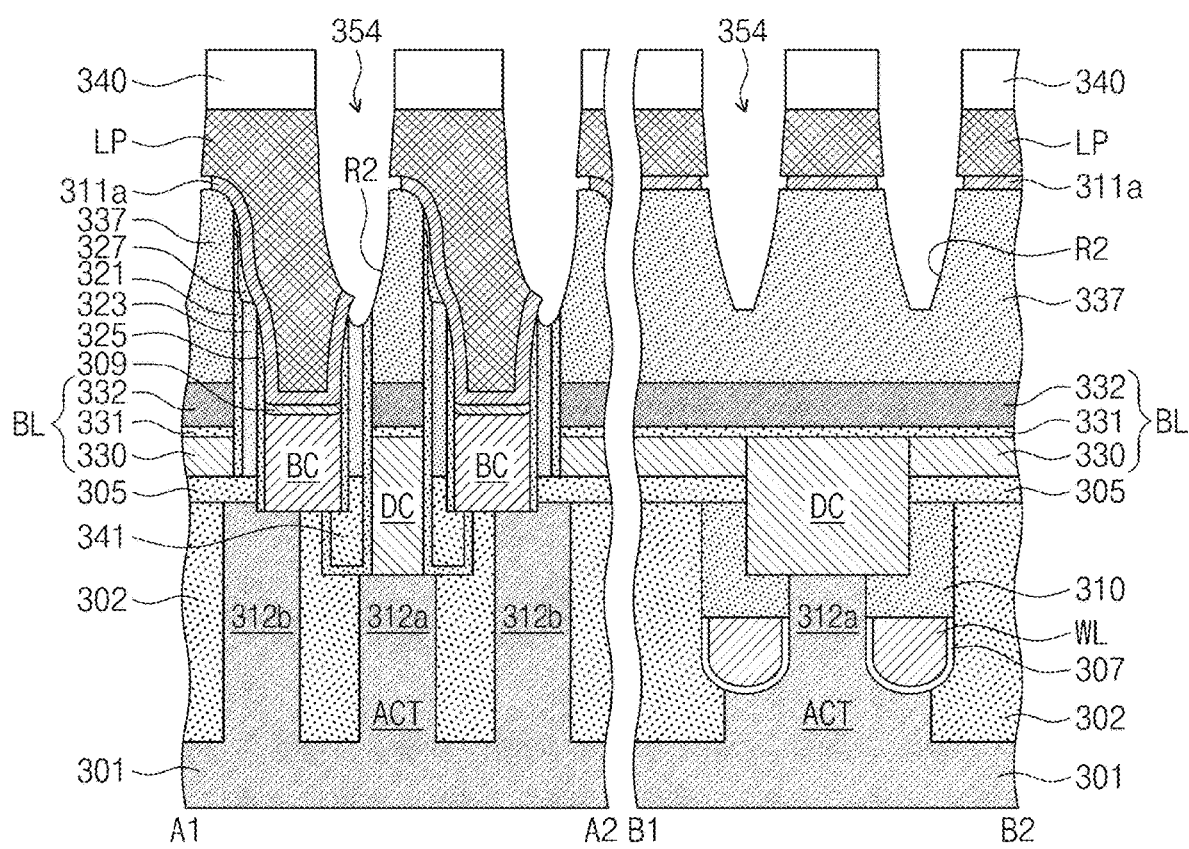
Figure 3K:
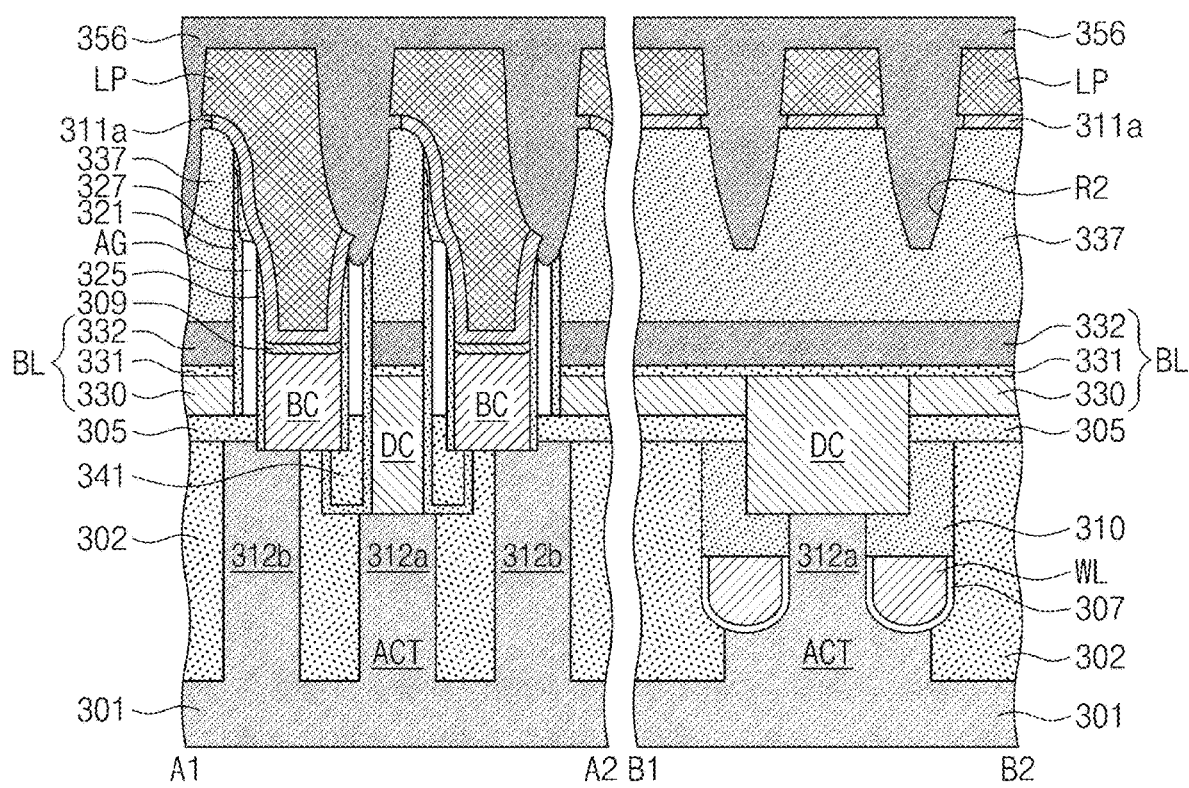
Figure 3L:
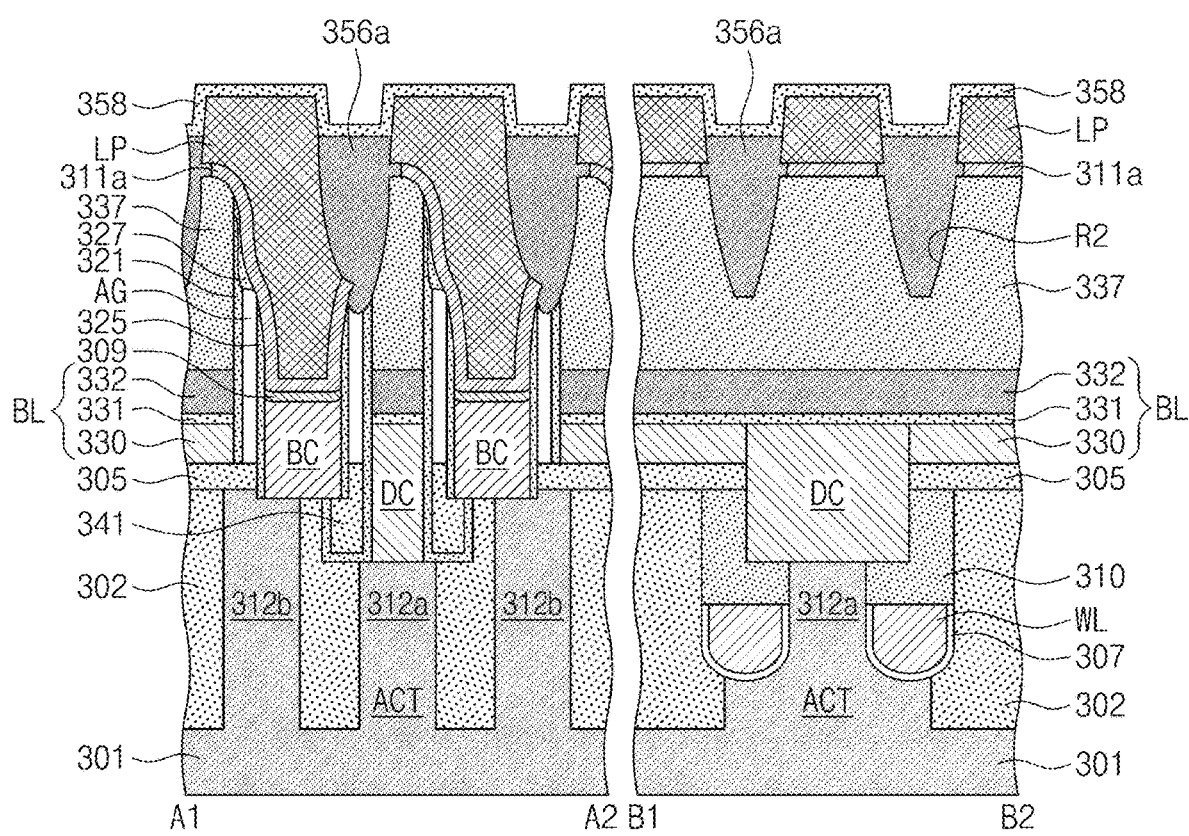
Figure 3M:
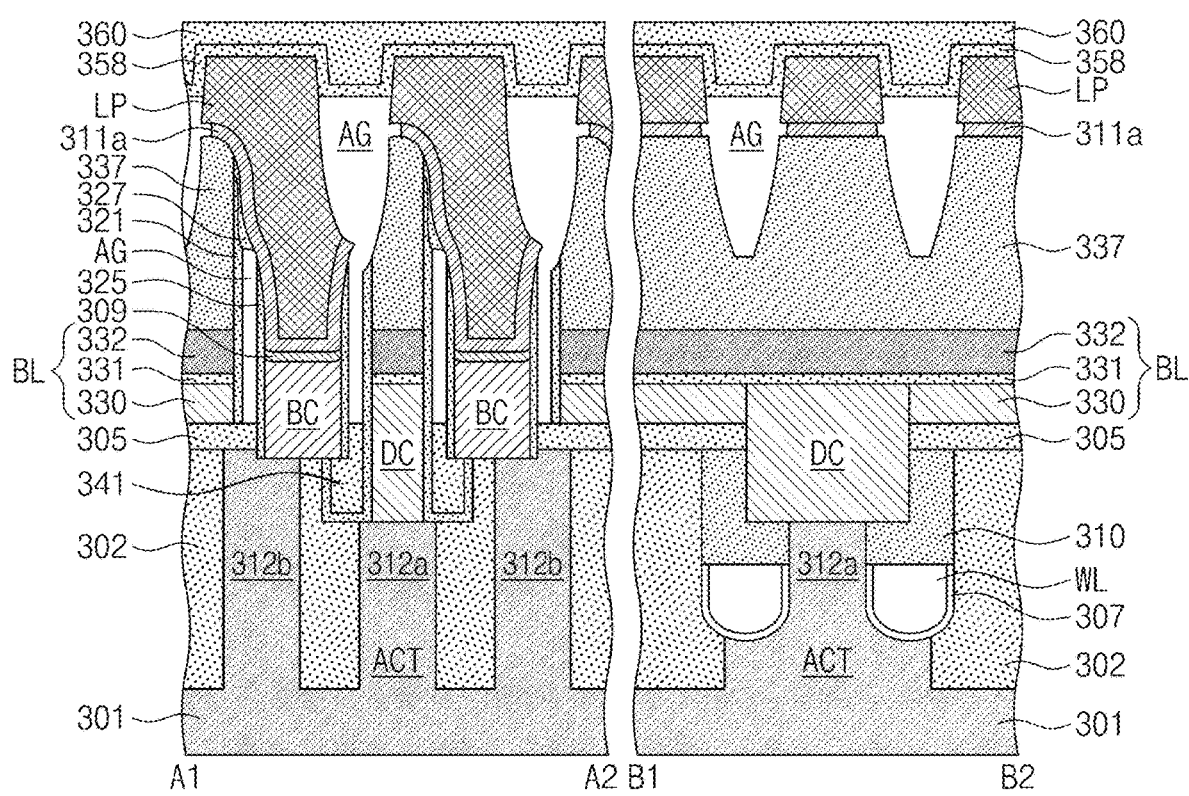
Figure 3N:
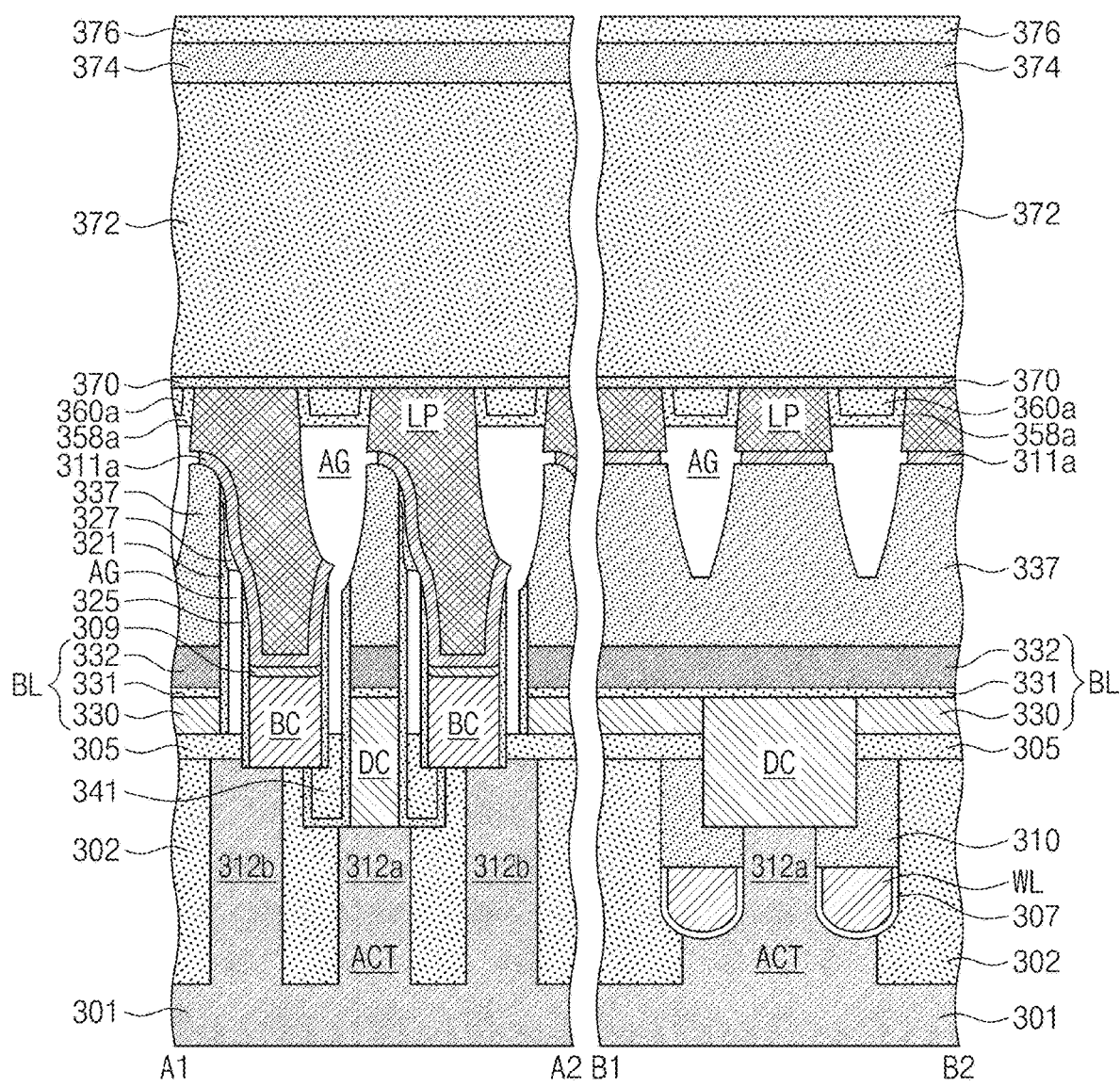
Figure 30:
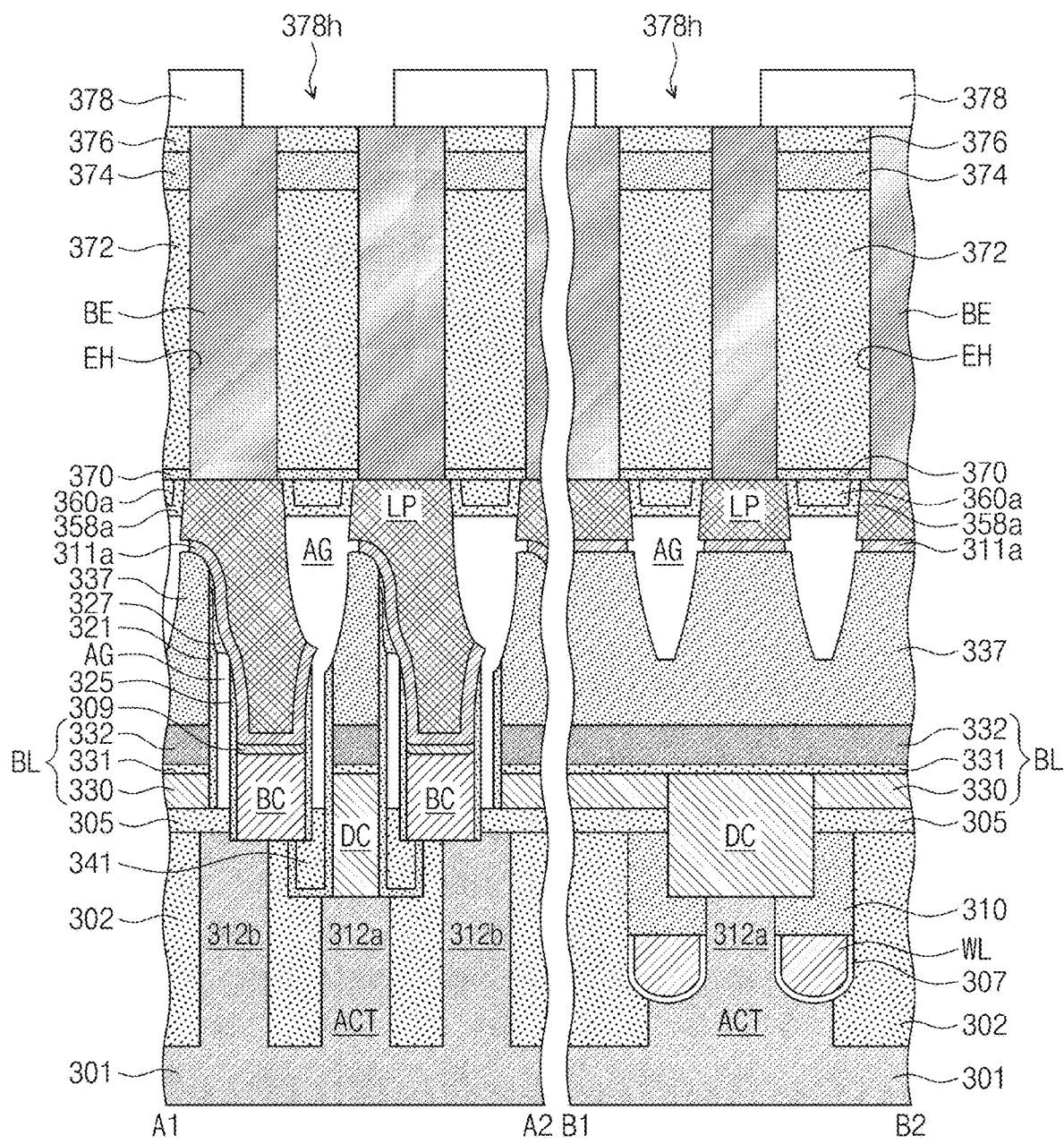
Figure 3P:
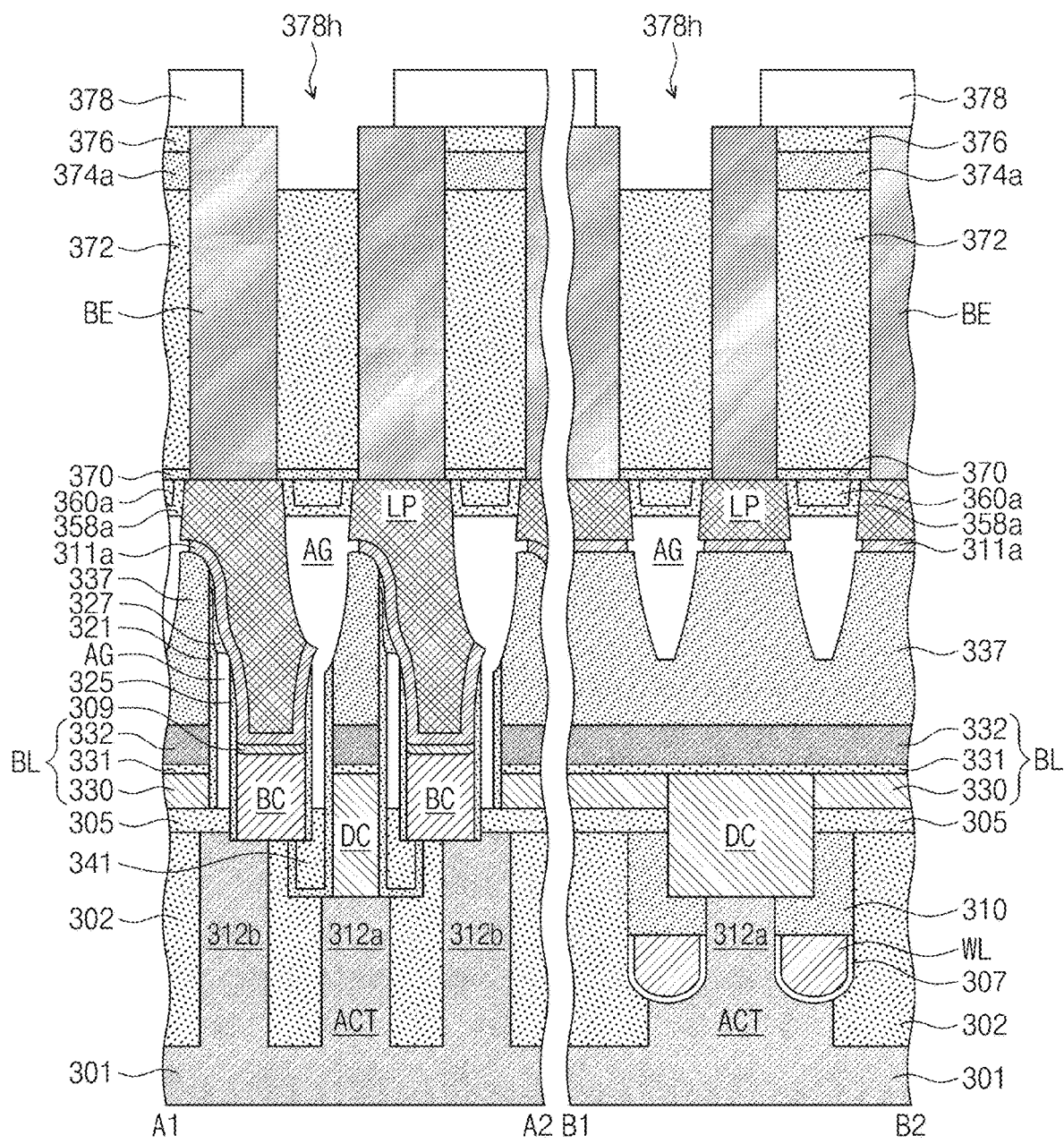
Figure 3Q:
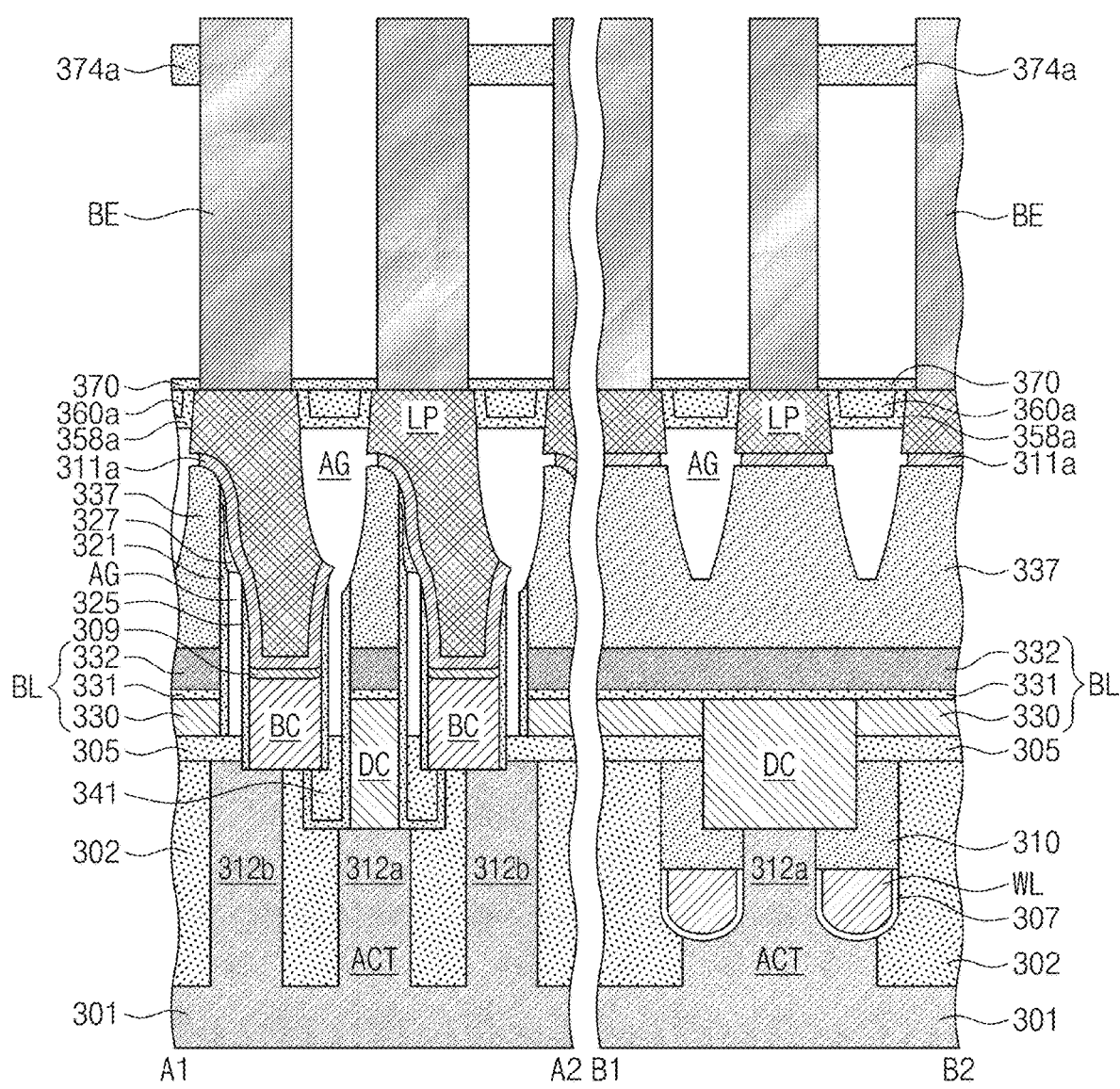
Figure 3R:
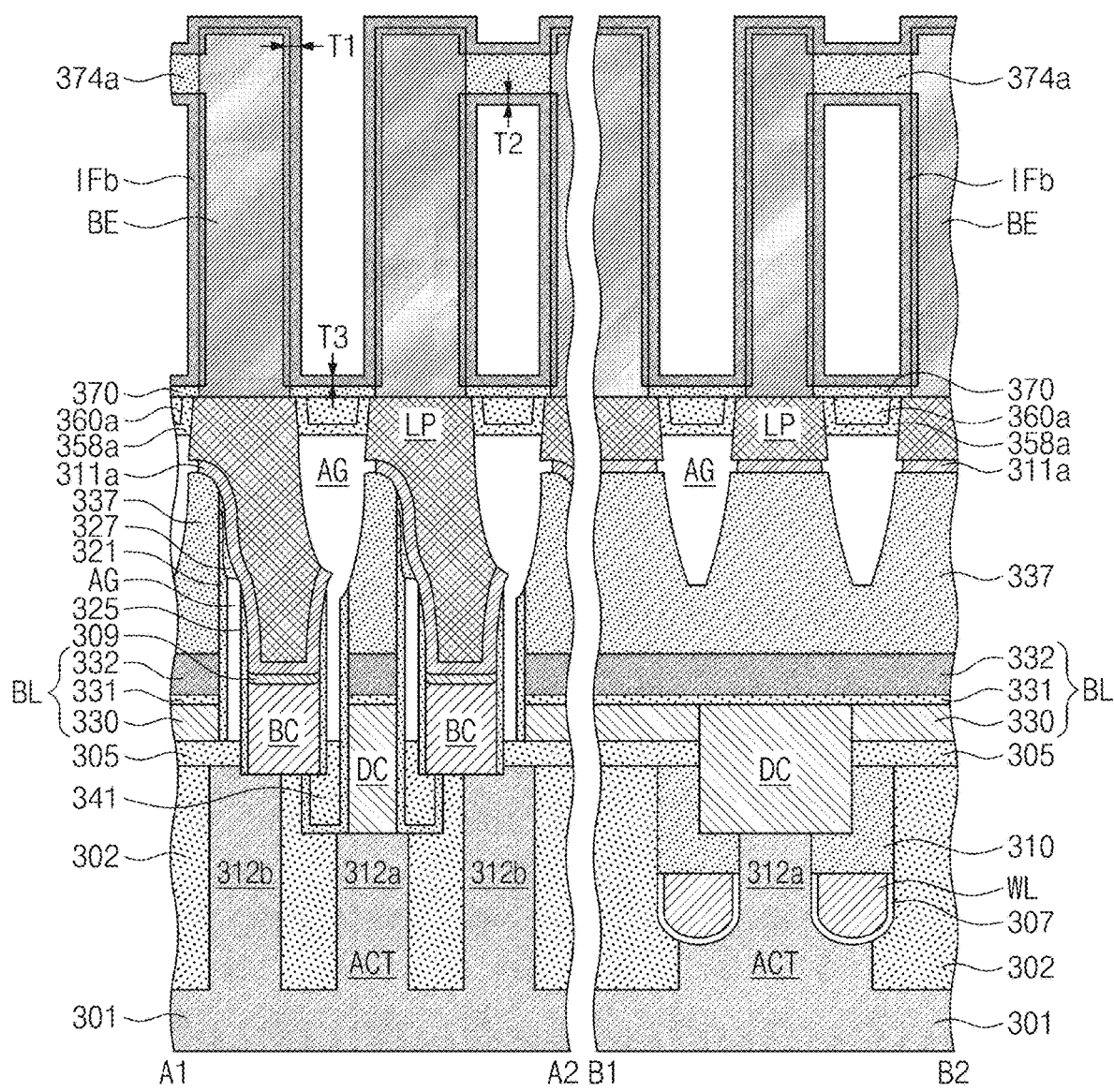
Figure 3S:
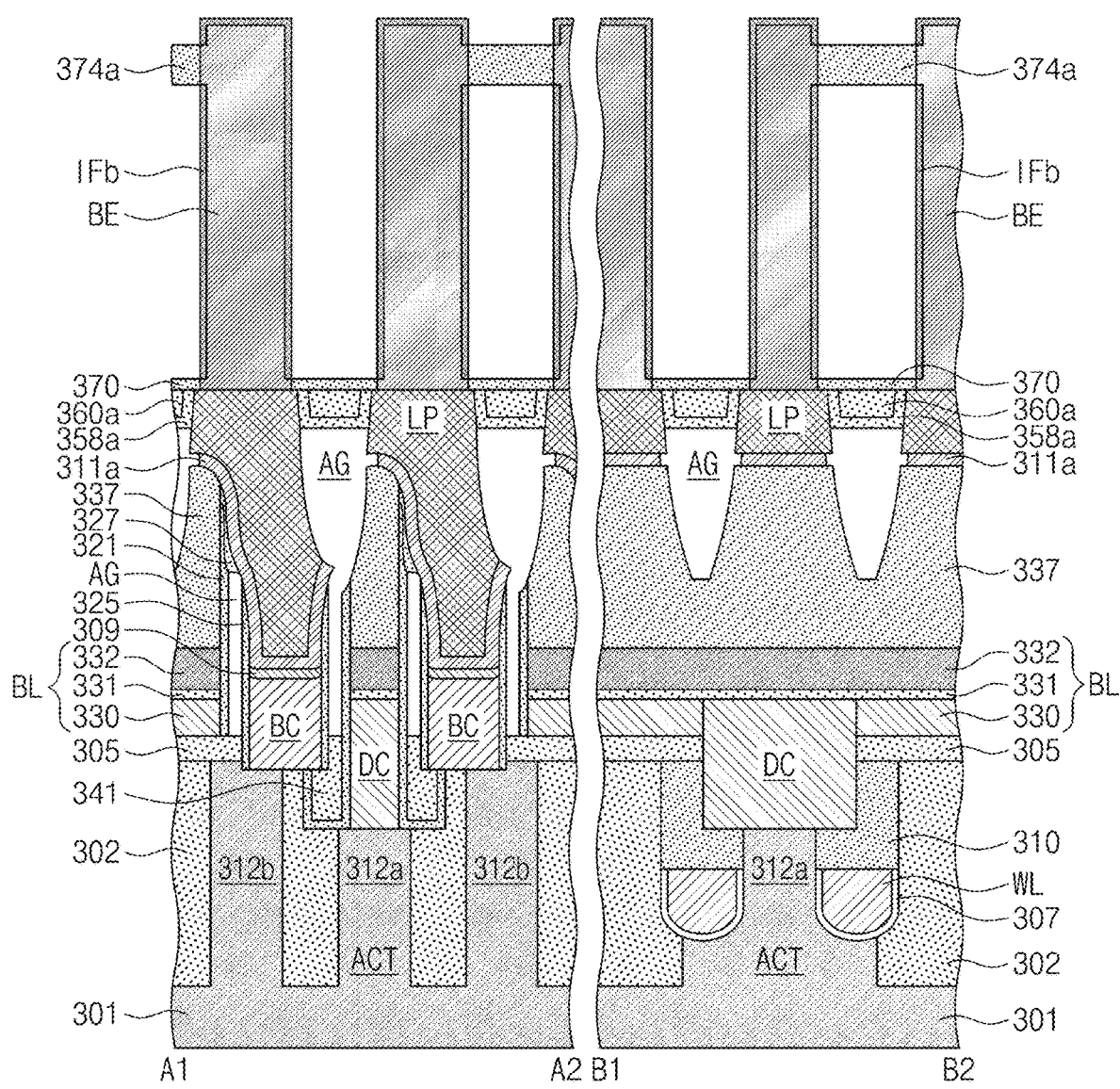
Figure 3T:
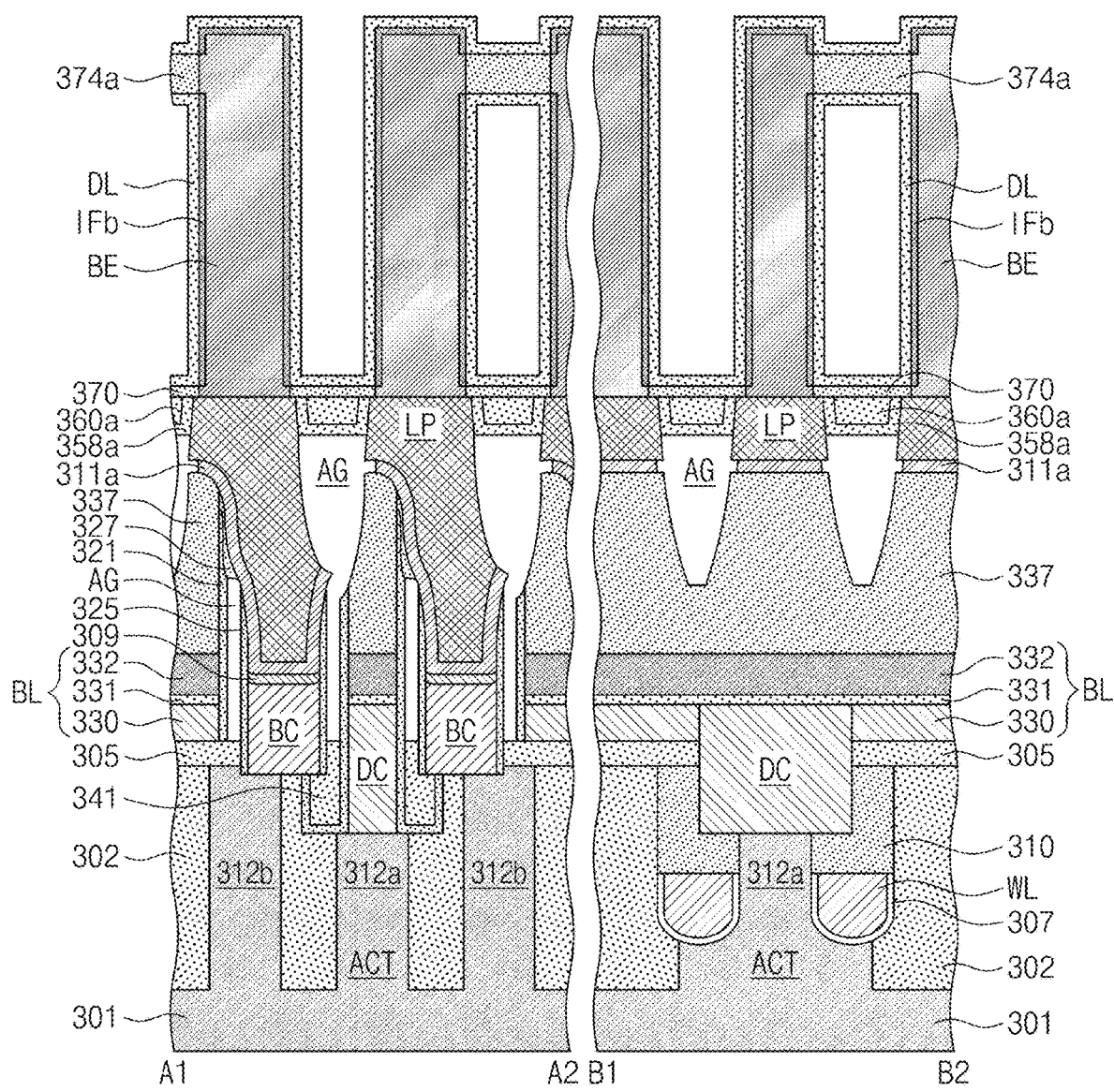

FIGS. 3A to 3T illustrate cross-sectional views taken along lines A1-A2 and B1-B2 of FIG. 2A, showing a method of fabricating a semiconductor memory device that includes a capacitor according to some example embodiments of the present inventive concepts.

Referring to FIG. 3A, a device isolation pattern 302 may be formed in a substrate 301, thereby defining active sections ACT. For example, a trench TR may be formed in the substrate 301, and the trench TR may be filled with a dielectric material to form the device isolation pattern 302. The active sections ACT and the device isolation pattern 302 may be etched to form grooves GR. Each of the grooves GR may have a curved bottom surface.

Word lines WL may be formed in corresponding grooves GR. A pair of word lines WL may run across the active sections ACT. Before the word lines WL are formed, a gate dielectric layer 307 may be formed on an inner surface of each of the grooves GR. The gate dielectric layer 307 may be formed by a thermal oxidation process, a chemical vapor deposition process, and/or an atomic layer deposition process. The grooves GR may be filled with a conductive layer deposited on the substrate 301, and then an etch-back process or a chemical mechanical polishing process may be performed to form the word lines WL in the grooves GR. The word lines WL may be recessed to have their stop surfaces lower than those of the active sections ACT. The grooves GR may be filled with a dielectric layer such as a silicon nitride layer formed on the substrate 301, and then the dielectric layer may be planarized to form word-line capping patterns 310 on corresponding word lines WL.

The word-line capping patterns 310 and the device isolation pattern 302 may be used as a mask to implant impurities into the active sections ACT. Therefore, first and second impurity regions 312a and 312b may be formed in the active sections ACT. The first and second impurity regions 312a and 312b may have their conductivity types different from that of the substrate 301. For example, when the substrate 301 has a P-type conductivity, each of the first and second impurity regions 312a and 312b may have an N-type conductivity.

Referring to FIG. 3B, an interlayer dielectric pattern 305 and a polysilicon mask pattern 330a may be formed on the substrate 301. For example, a dielectric layer and a first polysilicon layer may be sequentially formed on the substrate 301. The first polysilicon layer may be patterned to form the polysilicon mask pattern 330a. The polysilicon mask pattern 330a may be used as an etching mask to etch the dielectric layer, the device isolation pattern 302, the substrate 301, and the word-line capping patterns 310 to form a first recess R1 and the interlayer dielectric pattern 305. The interlayer dielectric pattern 305 may have a plurality of island shapes that are spaced apart from each other. A plurality of first recesses R1 may have a net shape when viewed in plan. The first recesses R1 may expose the first impurity regions 312a.

Referring to FIG. 3C, a second polysilicon layer 329 may be formed on the substrate 301, thereby filling the first recess R1. And then, the second polysilicon layer 329 may undergo a planarization process to remove the second polysilicon layer 329 on the polysilicon mask pattern 330a and to expose the polysilicon mask pattern 330a.

An ohmic layer 331a, a metal-containing layer 332a, and a capping layer 337a may be sequentially formed on the polysilicon mask pattern 330a and the second polysilicon layer 329. The ohmic layer 331a may be formed of metal silicide, such as cobalt silicide. A metal layer may be deposited on the polysilicon mask pattern 330a and the second polysilicon layer 329, and then an annealing process may be performed to form the ohmic layer 331a. The annealing process may cause the metal layer to react with the polysilicon mask pattern 330a and the second polysilicon layer 329, thereby forming the metal silicide. A non-reacted metal layer may be removed.

First mask patterns 339 may be formed on the capping layer 337a, defining a planar shape of a bit line BL which will be discussed below. The first mask patterns 339 may extend in the second direction D2 illustrated in FIG. 2A.

Referring to FIG. 3D, an etching process may be performed in which the first mask patterns 339 are used as an etching mask to sequentially etch the capping layer 337a, the metal-containing layer 332a, the ohmic layer 331a, the polysilicon mask pattern 330a, and the second polysilicon layer 329 to form a bit line BL, a bit-line contact DC, and a bit-line capping pattern 337. The bit line BL may include a polysilicon pattern 330, an ohmic pattern 331, and a metal-containing pattern 332. The etching process may partially expose a top surface of the interlayer dielectric pattern 305, and may also partially expose an inner sidewall and a bottom surface of the first recess R1. The first mask patterns 339 may be removed after the formation of the bit line BL and the bit-line contact DC.

Referring to FIG. 3E, a first spacer layer may be conformally formed on the substrate 301. The first spacer layer may conformally cover the bottom surface and the inner sidewall of the first recess R1. The first spacer layer may be, for example, a silicon nitride layer. The first recess R1 may be filled with a dielectric layer such as a silicon nitride layer formed on the substrate 301, and then the dielectric layer may experience an anisotropic etching process to leave a buried dielectric pattern 341 in the first recess R1. When the anisotropic etching process is performed, the first spacer layer may also be etched to form a first spacer 321.

A sacrificial spacer layer may be conformally formed on the substrate 301, and then an anisotropic etching process may be performed to form a sacrificial spacer 323 that covers a sidewall of the first spacer 321. The sacrificial spacer 323 may include a material having an etch selectivity with respect to the first spacer 321. The sacrificial spacer 323 may be formed of, for example, a silicon oxide layer.

A second spacer 325 may be formed to cover a sidewall of the sacrificial spacer 323. The second spacer 325 may be formed of, for example, a silicon nitride layer. The second impurity region 312b may be exposed after the formation of the sacrificial spacer 323 or of the second spacer 325.

Referring to FIG. 3F, a space between a plurality of bit lines BL may be filled with a polysilicon layer formed on the substrate 301, and then the polysilicon layer may be etched to form a preliminary storage node contact 350 and to expose upper portions of the first spacer 321, the sacrificial spacer 323, and the second spacer 325. The upper portions of the sacrificial spacer 323 and the second spacer 325 may be removed to cause the sacrificial spacer 323 and the second spacer 325 to have their top ends whose levels are the same as or similar to that of a top surface of the preliminary storage node contact 350. Therefore, the first spacer 321 may be exposed at the upper portion thereof.

This process may provide a larger process margin for forming a landing pad LP which will be discussed below. When the upper portions of the sacrificial spacer 323 and the second spacer 325 are removed, the upper portion of the first spacer 321 may also be partially removed to cause the first spacer 321 to have a small width.

Referring to FIG. 3G, a third spacer layer may be conformally formed on the substrate 301 and then anisotropically etched to form a third spacer 327 that covers a sidewall of the exposed upper portion of the first spacer 321. The third spacer 327 may cover an exposed top end of the sacrificial spacer 323. The preliminary storage node contact 350 may be etched to expose the upper portion of the second spacer 325 and simultaneously to form a storage node contact BC. The third spacer 327 may complement a damaged upper portion of the first spacer 321 and may cover the sacrificial spacer 323, thereby serving to reduce or prevent the bit line BL from being attacked by an etchant used for etching the storage node contact BC and a cleaning solution used in a subsequent cleaning process. As a result, the bit line BL may be protected from damage.

An ohmic layer 309 may be formed on the storage node contact BC, and a diffusion break layer 311 may be conformally formed on the substrate 301. A landing pad layer 352 may be formed on the substrate 301 and may fill a space between the bit-line capping patterns 337. The landing pad layer 352 may be, for example, a tungsten layer. Second mask patterns 340 may be formed on the landing pad layer 352. The second mask patterns 340 may be formed of, for example, an amorphous carbon layer (ACL). The second mask patterns 340 may define positions of landing pads LP which will be discussed below. The second mask patterns 340 may be formed to vertically overlap the storage node contacts BC.

Referring to FIG. 3H, an anisotropic etching process may be performed in which the second mask patterns 340 are used as an etching mask to remove a portion of the landing pad layer 352. Therefore, landing pads LP may be formed, and openings 354 may be formed to expose the diffusion break layer 311.

Referring to FIG. 3I, an isotropic etching process may be performed in which the diffusion break layer 311 exposed to the openings 354 is patterned to form diffusion break patterns 311a that are spaced apart from each other and simultaneously to expose the third spacers 327 and portions of top surfaces of the bit-line capping patterns 337. Depending on the degree of progress of the isotropic etching process, the diffusion break patterns 311a may be over-etched to partially expose a bottom surface of the landing pad LP.

Referring to FIG. 3J, an anisotropic etching process may be performed to remove portions of the bit-line capping patterns 337 exposed to the openings 354 and also to remove the third spacers 327, and as a result the sacrificial spacers 323 may be exposed. In this case, a second recess R2 may be formed on the bit-line capping pattern 337. Afterwards, the second mask patterns 340 may be removed.

Referring to FIG. 3K, an isotropic etching process may be performed in which the sacrificial spacer 323 is removed to form an air gap AG between the first spacer 321 and the second spacer 325. After that, a thermal decomposition layer 356 may be formed to fill the openings 354 and the second recesses R2. The thermal decomposition layer 356 may also be formed on the landing pads LP. The thermal decomposition layer 356 may close an upper portion of the air gap AG.

Referring to FIG. 3L, a first annealing process may be performed to thermally decompose and remove an upper portion of the thermal decomposition layer 356. The partial removal of the thermal decomposition layer 356 may expose top surfaces and upper sidewalls of the landing pads LP, and may form thermal decomposition patterns 356a that are spaced apart from each other. A first capping layer 358 may be conformally formed on the thermal decomposition patterns 356a and the landing pads LP.

Referring to FIG. 3M, a second annealing process may be performed to thermally decompose the thermal decomposition patterns 356a. The thermal decomposition patterns 356a, which has been thermally decomposed, may be outgassed through the first capping layer 358. Therefore, the air gap AG may expand from a space between the first and second spacers 321 and 325 into a space between the landing pads LP. A second capping layer 360 may be formed on the first capping layer 358.

Referring to FIG. 3N, an etch-back process or a chemical mechanical polishing process may be performed in which the first capping layer 358 and the second capping layer 360 are planarized to form a first capping pattern 358a and a second capping pattern 360a that are restricted between the landing pads LP. The planarization may remove the first capping layer 358 and the second capping layer 360 on the landing pads LP, and thus the landing pads LP may be exposed.

An etch stop layer 370 may be formed on the landing pads LP, the first capping pattern 358a, and the second capping pattern 360a. A first mold layer 372, a support layer 374, and a second mold layer 376 may be formed on the etch stop layer 370. The etch stop layer 370 and the support layer 374 may be formed of, for example, a silicon nitride layer. The first mold layer 372 and the second mold layer 376 may be formed of a material having an etch selectivity with respect to the support layer 374. For example, the first mold layer 372 and the second mold layer 376 may be formed of a silicon oxide layer.

Referring to FIG. 3O, the second mold layer 376, the support layer 374, the first mold layer 372, and the etch stop layer 370 may be sequentially patterned to form electrode holes EH that expose the landing pads LP. A conductive layer may be formed to fill the electrode holes EH, and then an etch-back process or a chemical mechanical polishing process may be performed to remove the conductive layer on the second mold layer 376 and also to form a bottom electrode BE in the electrode hole EH. A third mask pattern 378 may be formed on the second mold layer 376. The third mask pattern 378 may have a plurality of openings 378h. The opening 378h may expose top surfaces of adjacent bottom electrodes BE and also expose the second mold layer 376 between the adjacent bottom electrodes BE.

Referring to FIG. 3P, an anisotropic etching process may be performed in which the third mask pattern 378 is used as an etching mask to remove the second mold layer 376 exposed to the opening 378h and also to remove the support layer 374 below the second mold layer 376. Accordingly, a support pattern 374a may be formed, and the first mold layer 372 below the opening 378h may be exposed.

Referring to FIG. 3Q, the third mask pattern 378 may be removed to expose the second mold layer 376. An isotropic etching process may be performed in which the first and second mold layers 372 and 376 are all removed to expose surfaces of the bottom electrode BE, the support pattern 374a, and the etch stop layer 370.

Referring to FIG. 3R, an interface layer IFb may be formed on the exposed surface of the bottom electrode BE. In this case, the interface layer IFb may also be formed on the exposed surface of the support pattern 374a and on the exposed surface of the etch stop layer 370. When the interface layer IFb is formed, a constituent of the interface layer IFb may diffuse into the bottom electrode BE. Thus, a portion of the bottom electrode BE may be changed into the interface layer IFb.

For another example, a deposition condition may be controlled such that the interface layer IFb is deposited at relatively high rate on the bottom electrode BE and at relatively low rate on the support pattern 374a and the etch stop layer 370. The interface layer IFb may have a thickness that is non-uniform due to a difference in diffusion rate or deposition rate. For example, the interface layer IFb may have a first thickness T1 on the bottom electrode BE, a second thickness T2 on the support pattern 374a, and a third thickness T3 on the etch stop layer 370. The second thickness T2 may be less than the first thickness T1, and the third thickness T3 may be less than the first thickness T1 and the same as or similar to the second thickness T2.

The interface layer IFb may correspond to the interface layer 20 discussed above with reference to FIG. 1A. The description of the interface layer 20 in FIG. 1A may be applicable identically or similarly to the interface layer IFb. For example, the interface layer IFb may include NbTiON. Niobium (Nb) may have an amount of about 5 at % or less, narrowly from about 2 at % to about 3 at %. For another example, the interface layer IFb may include ZrNbTiON, HfNbTiON, or a combination thereof.

Referring to FIG. 3S, an etching process may be performed to remove a portion of the interface layer IFb. When the interface layer IFb has semiconductor properties, neighboring bottom electrodes BE may be electrically connected to each other. Therefore, the interface layer IFb may be partially removed on the support pattern 374a and the etch stop layer 370. In some embodiments, the etching process may be performed without an etching mask. As discussed above, because the interface layer IFb has a relatively larger thickness (e.g., T1) on the bottom electrode BE and relatively smaller thicknesses (e.g., T2 and T3) on the support pattern 374a and the etch stop layer 370, the interface layer IFb may remain on the bottom electrode BE even if the etching process is performed without an etching mask.

Referring to FIG. 3T, a dielectric layer DL may be formed on the substrate 301. The dielectric layer DL may cover the interface layer IFb, the support pattern 374a, and the etch stop layer 370. The dielectric layer DL may correspond to the dielectric layer 30 of FIG. 1A. The description of the dielectric layer 30 in FIG. 1A may be applicable identically or similarly to the dielectric layer DL. For example, the dielectric layer DL may be formed by depositing zirconium oxide (e.g., $ZrO_x$) or hafnium oxide (e.g., $HfO_x$). When the dielectric layer DL is formed, at least one constituent, such as hafnium (Hf) or zirconium (Zr), of the dielectric layer DL may diffuse or migrate into the interface layer IFb. Therefore, when the interface layer IFb includes NbTiON, the interface layer IFb may further include a metallic constituent, such as hafnium (Hf) or zirconium (Zr), which is a metallic constituent of the dielectric layer DL. For example, the interface layer IFb may include ZrNbTiON, HfNbTiON, or a combination thereof.

Referring back to FIG. 2B, a top electrode TE may be formed on the dielectric layer DL, covering the bottom electrodes BE. Therefore, a semiconductor memory device 1000 may be fabricated which has a capacitor CAP including the bottom electrode BE, the top electrode TE, the dielectric layer DL between the bottom and top electrodes BE and TE, and the interface layer IFb between the bottom electrode BE and the dielectric layer DL. The capacitor CAP may correspond to the capacitor 1 of FIG. 1A. The description of the capacitor 1 in FIGS. 1A, 1C, and 1D may be applicable identically or similarly to the capacitor CAP. For example, as discussed above in FIGS. 1C and 1D, the capacitor CAP may reduce, potentially remarkably, a difference between maximum and minimum values of capacitance.

For another example, as shown in FIG. 2C, an interface layer IFt may further be formed on the dielectric layer DL. Different from the formation of the interface layer IFb, the formation of the interface layer IFt may have no requirement to perform an etching process that removes a portion of the interface layer IFt. A top electrode TE may be formed on the interface layer IFt. Therefore, a capacitor CAP may be formed which includes the bottom electrode BE, the top electrode TE, the dielectric layer DL between the bottom and top electrodes BE and TE, the interface layer IFb between the bottom electrode BE and the dielectric layer DL, and the interface layer IFt between the top electrode TE and the dielectric layer DL. The interface layer IFt may correspond to the interface layer 40 of FIG. 1B, and the description of the interface layer 40 may be applicable identically or similarly to the interface layer IFt.

According to the present inventive concepts, NbTiON may be included in an interface layer between a capacitor bottom electrode and a capacitor dielectric layer, and a metallic constituent of the capacitor dielectric layer may further be included in the interface layer. Therefore, a minimum value of capacitance may increase to obtain sufficient capacitance, and as a result a semiconductor memory device may have enhanced reliability.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A semiconductor memory device comprising:
a substrate;
a capacitor bottom electrode disposed over the substrate and including titanium nitride;
a first interface layer disposed on the capacitor bottom electrode;
a capacitor dielectric layer disposed on the first interface layer and including hafnium oxide; and
a capacitor top electrode disposed on the capacitor dielectric layer,
wherein the first interface layer includes a combination of hafnium (Hf), niobium (Nb), titanium (Ti), oxygen (O), and nitrogen (N).

2. The semiconductor memory device of claim 1, wherein the first interface layer includes HfNbTiON.

3. The semiconductor memory device of claim 1, further comprises a second interface layer that is disposed between the capacitor dielectric layer and the capacitor top electrode.

4. The semiconductor memory device of claim 3, wherein the second interface layer includes a combination of titanium (Ti), oxygen (O), and nitrogen (N).

5. The semiconductor memory device of claim 3, wherein the second interface layer includes a combination of niobium (Nb), titanium (Ti), oxygen (O), and nitrogen (N).

6. The semiconductor memory device of claim 5, wherein niobium (Nb) contained in the second interface layer has an amount of about 5 at % or less, narrowly about 2 at % to about 3 at %.

7. The semiconductor memory device of claim 3, wherein the second interface layer includes a combination of niobium (Nb), titanium (Ti), oxygen (O), and nitrogen (N), and a metallic constituent of the capacitor dielectric layer.

8. The semiconductor memory device of claim 1, wherein niobium (Nb) contained in the first interface layer has an amount of about 5 at % or less, narrowly about 2 at % to about 3 at %.

9. The semiconductor memory device of claim 1, wherein the capacitor top electrode includes titanium nitride.

10. The semiconductor memory device of claim 1, wherein the capacitor dielectric layer includes zirconium oxide.

11. The semiconductor memory device of claim 1, further comprises a support pattern that contacts a side surface of the capacitor bottom electrode, and
wherein the first interface layer is spaced apart from the side surface of the capacitor bottom electrode.

12. A semiconductor memory device comprising:
a substrate;
a capacitor bottom electrode disposed over the substrate and including titanium nitride;
a first interface layer disposed on the capacitor bottom electrode;
a capacitor dielectric layer disposed on the first interface layer and including hafnium oxide and zirconium oxide;
a second interface layer disposed on the capacitor dielectric layer; and
a capacitor top electrode disposed on the second interface layer and including titanium nitride,
wherein the first interface layer includes a combination of hafnium (Hf), niobium (Nb), titanium (Ti), oxygen (O), and nitrogen (N), and
the second interface layer includes a combination of titanium (Ti), oxygen (O), and nitrogen (N).

13. The semiconductor memory device of claim 12, wherein the first interface layer includes HfNbTiON.

14. The semiconductor memory device of claim 12, wherein niobium (Nb) contained in the first interface layer has an amount of about 5 at % or less, narrowly about 2 at % to about 3 at %.

15. The semiconductor memory device of claim 12, further comprises a support pattern that contacts a side surface of the capacitor bottom electrode, and
wherein the first interface layer is spaced apart from the side surface of the capacitor bottom electrode.

16. A semiconductor memory device comprising:
a substrate;
a capacitor bottom electrode disposed over the substrate and including titanium nitride;
a first interface layer disposed on the capacitor bottom electrode;
a capacitor dielectric layer disposed on the first interface layer and including hafnium oxide and zirconium oxide;
a second interface layer disposed on the capacitor dielectric layer; and
a capacitor top electrode disposed on the second interface layer and including titanium nitride,
wherein the first interface layer includes a combination of hafnium (Hf), niobium (Nb), titanium (Ti), oxygen (O), and nitrogen (N), and
the second interface layer includes a combination of niobium (Nb), titanium (Ti), oxygen (O), and nitrogen (N).

17. The semiconductor memory device of claim 16, wherein the first interface layer includes HfNbTiON.

18. The semiconductor memory device of claim 16, wherein niobium (Nb) contained in the first interface layer has an amount of about 5 at % or less, narrowly about 2 at % to about 3 at %.

19. The semiconductor memory device of claim 16, wherein niobium (Nb) contained in the second interface layer has an amount of about 5 at % or less, narrowly about 2 at % to about 3 at %.

20. The semiconductor memory device of claim 16, further comprises a support pattern that contacts a side surface of the capacitor bottom electrode, and
wherein the first interface layer is spaced apart from the side surface of the capacitor bottom electrode.

* * * * *